United States Patent [19]

Ward et al.

[11] Patent Number: 5,214,784
[45] Date of Patent: May 25, 1993

[54] SEQUENCE OF EVENTS DETECTOR FOR SERIAL DIGITAL DATA WHICH SELECTIVELY OUTPUTS MATCH SIGNAL IN THE SERIES WHICH DEFINES DETECTED SEQUENCE

[75] Inventors: Benjamin A. Ward, Portland; Michael C. Seckora, Gaston, both of Oreg.

[73] Assignee: Tektronix, Inc., Wilsonville, Oreg.

[21] Appl. No.: 276,731

[22] Filed: Nov. 28, 1988

[51] Int. Cl.⁵ .............................................. G06F 9/00
[52] U.S. Cl. .................. 395/800; 364/944.6; 364/943.92; 364/947.2; 364/949.2; 364/DIG. 2
[58] Field of Search ... 364/200 MS File, 900 MS File, 364/487; 324/121 R; 395/800; 340/825.04; 371/24, 25.1

[56] References Cited

U.S. PATENT DOCUMENTS

| | | | |
|---|---|---|---|
| 4,100,532 | 7/1978 | Fernbach | 340/146.3 |
| 4,107,651 | 8/1978 | Martin | 340/146.1 |
| 4,228,513 | 10/1980 | Doljack | 364/550 |
| 4,231,106 | 10/1980 | Heap | 364/550 |
| 4,353,032 | 10/1982 | Taylor | 328/165 |
| 4,495,621 | 1/1985 | Nakagomi et al. | 371/6 |
| 4,495,642 | 1/1985 | Zellmer | 364/487 |
| 4,514,823 | 4/1985 | Mendelson | 364/900 |
| 4,550,387 | 10/1985 | Takita | 364/900 |
| 4,574,358 | 3/1986 | Peterson | 364/550 |
| 4,585,975 | 4/1986 | Wimmer | 315/392 |
| 4,713,813 | 12/1987 | Sugimori et al. | 371/15 |
| 4,716,536 | 12/1987 | Blanchard | 364/550 |
| 4,719,416 | 1/1988 | Desantels | 364/487 |
| 4,736,199 | 4/1988 | Chadwick | 340/721 |
| 4,743,844 | 5/1988 | Odenheimer | 364/487 |
| 4,748,348 | 5/1988 | Thong | 307/517 |
| 4,779,028 | 10/1988 | Blair | 364/487 |
| 4,779,045 | 10/1988 | Shank | 364/487 |
| 4,797,936 | 1/1989 | Nakatsugawa | 364/487 |
| 4,807,147 | 2/1989 | Halbert | 364/487 |
| 4,823,076 | 4/1989 | Haines | 364/487 |
| 4,855,682 | 8/1989 | Van Groningen | 328/63 |
| 4,907,175 | 3/1990 | Van Alphen | 364/550 |
| 4,907,229 | 3/1990 | Edwards | 364/200 |
| 4,928,251 | 5/1990 | Marzalek | 364/484 |
| 4,977,514 | 12/1990 | Bush | 364/487 |
| 4,980,844 | 12/1990 | Demjaneako | 364/551.02 |
| 4,980,845 | 12/1990 | Gouekav | 364/550 |
| 4,989,129 | 1/1991 | Arita | 371/24 |
| 4,996,654 | 2/1991 | Rosenow | 364/521 |

*Primary Examiner*—Thomas C. Lee
*Assistant Examiner*—Eric Coleman
*Attorney, Agent, or Firm*—Boulden G. Griffith; Francis I. Gray

[57] ABSTRACT

A sequence of events detector provides a way to continuously monitor serial digital data and precisely define the behavior that it must exhibit in order to qualify as the sequence of events that the user wishes to detect. A plurality of evaluation windows each sequentially examine the behavior of one or more signals, comparing this behavior with predefined criteria. Each evaluation window is activated to begin its portion of the overall evaluation process by a match signal from the preceding window, indicating that its predefined criteria were met. In one version, a sequence starting circuit activates the first evaluation window in response to an external signal or the occurrence of a predefined condition, and a multiplexer trigger source circuit selects as the overall detector output the match signal output of the last evaluation window used to define the overall sequence of events. In another version, each evaluation window explicitly reports a failure if its predefined criteria are not met.

29 Claims, 35 Drawing Sheets

MUX SOURCE SELECTION

| Trig. Source | S4 | S3 | S2 | S1 | S0 | Y | X |
|---|---|---|---|---|---|---|---|
| Match1  | 1 | 1 | 1 | 1 | 0 | 0 | 0 |
| Match2  | 1 | 1 | 1 | 1 | 0 | 0 | 1 |
| Match3  | 1 | 1 | 1 | 1 | 0 | 1 | 0 |
| Match4  | 1 | 1 | 1 | 1 | 0 | 1 | 1 |
| Match5  | 1 | 1 | 1 | 0 | 1 | 0 | 0 |
| Match6  | 1 | 1 | 1 | 0 | 1 | 0 | 1 |
| Match7  | 1 | 1 | 1 | 0 | 1 | 1 | 0 |
| Match8  | 1 | 1 | 1 | 0 | 1 | 1 | 1 |
| Match9  | 1 | 1 | 0 | 1 | 1 | 0 | 0 |
| Match10 | 1 | 1 | 0 | 1 | 1 | 0 | 1 |
| Match11 | 1 | 1 | 0 | 1 | 1 | 1 | 0 |
| Match12 | 1 | 1 | 0 | 1 | 1 | 1 | 1 |
| Match13 | 1 | 0 | 1 | 1 | 1 | 0 | 0 |
| Match14 | 1 | 0 | 1 | 1 | 1 | 0 | 1 |
| Match15 | 1 | 0 | 1 | 1 | 1 | 1 | 0 |
| Match16 | 1 | 0 | 1 | 1 | 1 | 1 | 1 |
| Match17 | 0 | 1 | 1 | 1 | 1 | 0 | 0 |
| Off     | 0 | 1 | 1 | 1 | 1 | 0 | 1 |
| On      | 0 | 1 | 1 | 1 | 1 | 1 | 0 |
| Off     | 0 | 1 | 1 | 1 | 1 | 1 | 1 |

| Trig. Mode | MODE |
|---|---|
| Pulse Trig. | 0 |
| Latch Trig. | 1 |

*FIG.18B*

SEQUENCE OF EVENTS DETECTOR FOR SERIAL DIGITAL DATA WHICH SELECTIVELY OUTPUTS MATCH SIGNAL IN THE SERIES WHICH DEFINES DETECTED SEQUENCE

BACKGROUND OF THE INVENTION

This invention relates to the field of signal identification, and more particularly to the field of recognizing a user defined sequence of events in serial digital data on one or more lines.

Recognizing the presence of a particular combination of logic states across a number of digital signal lines is not new. Logic analyzers have utilized word recognizers that perform this function for many years, since the earliest logic analyzers appeared on the market in the 1970s.

As logic analyzers have become more sophisticated and complex over the years, the ways in which a desired trigger condition can be defined have multiplied, and now include elaborate triggering facilities. Many of the triggering facilities present in modern logic analyzers include some sort of sequential state machine that ascertains when the signals under test have reached a particular condition after a complex series of other conditions have occurred in a particular sequence.

Logic analyzer triggering, complex though it has become, is based on separate and discrete views into the system under test which only occur at the time of a sampling clock. While some logic analyzers can augment this limited view with glitch detection, glitch detection usually only consists of ascertaining whether multiple transitions of the signal in question across the reference threshold occurred between sample clocks and does not resolve timing details about the detected activity that qualified as a glitch.

Oscilloscope triggering was for many years generated by the excursion of a signal under test past a preset amplitude threshold in a particular direction. Recently, oscilloscope triggering has grown to include the word recognition concept from the field of logic analysis. In this approach, a digital trigger section which includes a word recognizer monitors a digital version of multiple input channels waiting for a particular combination to appear before a trigger is generated. Oscilloscopes that can be triggered in this fashion are very useful in a modern digital environment, because it is often necessary to have an analog look at the activity of a signal during a time that is most easily specified in terms of the digital condition of a number of different signals. Refer to U.S. Pat. No. 4,585,975, to Wimmer for a "High Speed Boolean Logic Trigger Oscilloscope Vertical Amplifier with Edge Sensitivity and Nested Trigger", which discloses the combination of a digital trigger path with an analog signal path.

Oscilloscope triggering was further advanced by the disclosure in U.S. Pat. No. 4,748,348, to Thong, for a "Multi-Level Pattern Detector for a Single Signal". Thong disclosed a method and apparatus for detecting the occurrence of a plurality of selected sequential events in a single monitored signal. However, Thong's approach has a limitation which it would be desirable to eliminate. The apparatus disclosed by Thong allows the user to define a plurality of sequential events and logically connect them to each other through the use of a state machine, logic, and variable delay devices. Because the events are interrelated over time by these delay lines, events which occur during the delay intervals do not influence the resulting trigger generation. A consequence of this is that when the selected sequential events are temporally non-contiguous, the intervals between events are automatically in effect "don't care" from the user's point of view, whether this is what the user wishes or not.

What is desired is an approach to detection of sequences of events in serial digital data in which the intervals between signal transitions are explicitly dealt with, thus allowing the precise and continuous monitoring of the signal in question so that all of its behavior may be more accurately specified by the user as he defines the pattern to be recognized.

SUMMARY OF THE INVENTION

The present invention is a sequence of events detector that provides a way to continuously monitor one or more digital signals and precisely define the behavior that the signals must exhibit in order to qualify as the sequence of events that the user wishes to detect or trigger on.

A plurality of evaluation windows, all connected in parallel to the signal or signals to be examined, sequentially examine the behavior of the signal or signals, comparing this behavior with predefined criteria. Each of the evaluation windows are activated to begin their portion of the overall evaluation when they receive a match signal from the preceding window indicating that its criteria were met. Because each window is an independent process that activates the next process as soon as its own criteria are satisfied, the signals are continuously evaluated and there are no unintended "don't care" periods. Also, multiple evaluations of the signal or signals can be conducted concurrently by different evaluation windows, so that similar sequences of events arriving in close succession can still be effectively evaluated.

In one embodiment, a sequence start circuit activates the first evaluation window in response to an external signal or the first occurrence of a predefined condition, and a multiplexer trigger source circuit selects as the overall trigger output the match signal output of the last evaluation window used to define the overall sequence of events.

BRIEF DESCRIPTION OF THE DRAWINGS

FIG. 18B is a truth table for the circuit of FIG. 18A showing mux source selection logic and trigger mode.

DETAILED DESCRIPTION

Figure 1:
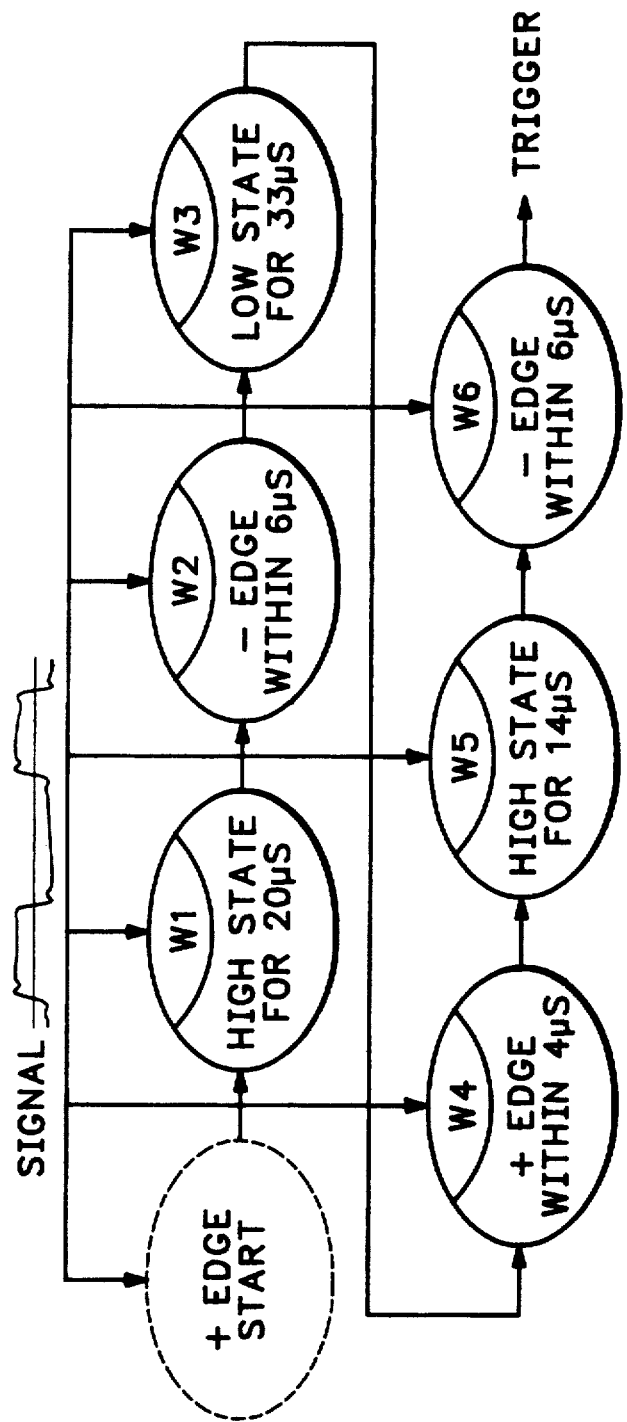
FIG. 1 shows how multiple evaluation windows are used to define a sequence of events to be recognized in a single signal.

FIG. 1 shows how multiple evaluation windows are used to specify a sequence of events to be recognized in a single signal. In the example of FIG. 1, the user wishes to produce a trigger right after a signal of interest goes high for 23 usec +/−3 usec, then low for 35 usec +/−2 usec, and finally high for 17 usec +/−3 usec period. This is accomplished using the present invention by defining six evaluation windows as follows:

First, the operator specifies that this signal begins with a positive-going edge. This information programs the sequence start circuitry, so that it will activate the first evaluation window after every positive-going edge. The desired signal will remain high a minimum of 20 usec (23 usec −3 usec) following the first positive-going edge. So, the first evaluation window is defined as: W1 = high for 20 usec. Next, the signal should fall sometime within the next 6 usec after the end of the first window. This is the plus or minus three microseconds of uncertainty about the duration of this portion of the signal. So, the second evaluation window is defined as: W2 = neg. edge within 6 usec, as shown in FIG. 1. The signal of interest, when it occurs, will then stay low for a minimum of 33 usec (35 usec −2 usec), so the third evaluation window should be: W3 = Low for 33 seconds.

If the signal is still behaving as desired, it will next go high within 4 usec. Therefore, our fourth evaluation window is: W4 = pos. edge within 4 usec. Then the signal, if it is the one we are looking for, will remain high for a minimum of 14 usec, after which it will go low within the next 6 usec. Accordingly, our last two evaluation windows should be: W5 = high for 14 usec; and W6 = neg. edge within 6 usec.

Figure 2A:
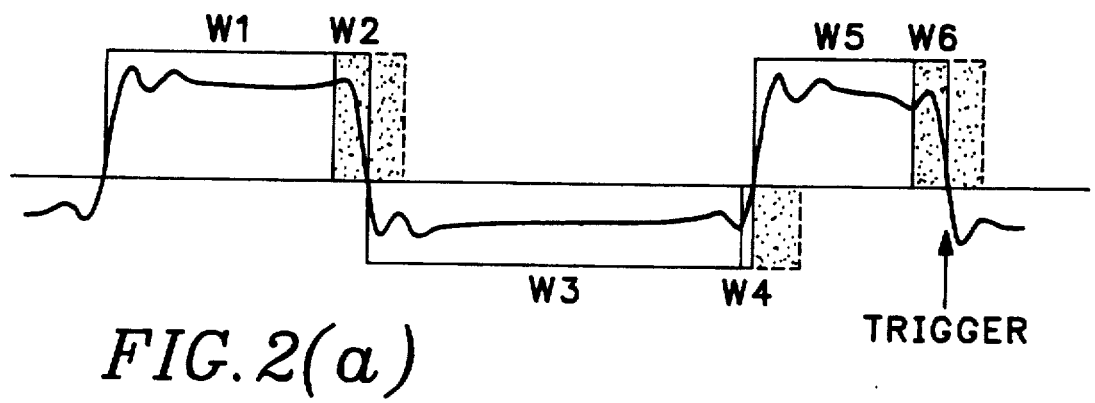
FIGS. 2A and 2B show two cases of a single signal being evaluated by the multiple evaluation windows defined in FIG. 1.
Figure 2B:
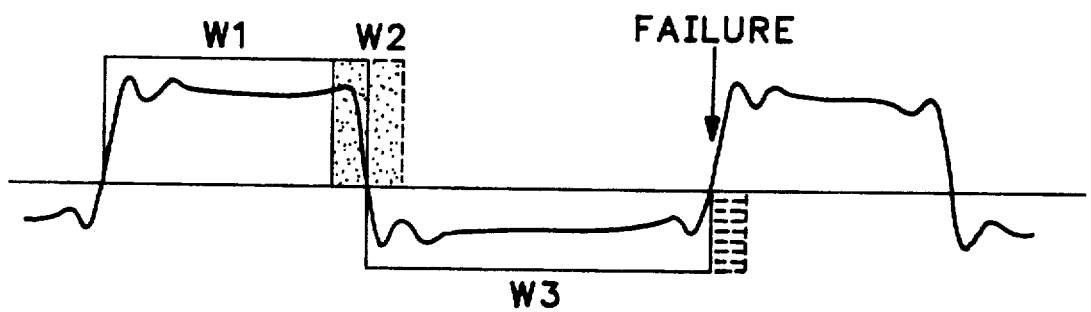

FIG. 2 shows the criteria of these six evaluation windows being applied to two signals, one of which exhibits the specified behavior while the other does not. The first signal satisfies all six windows in succession and therefore causes a trigger to be generated. The other signal meets the criteria for the first two evaluation windows, but fails to stay low long enough to meet the criteria of the third window.

FIGS. 1 and 2 show how the sequence of events detector operates on a single input signal. The events that can be defined for a single signal are: staying high, staying low, transitioning from high to low, transitioning from low to high, and "don't care". Each evaluation window is also programmed with a duration, the time within which the specified transition is to occur, or how long the steady state of a signal must last, or, in the case of a "don't care", how long the window lasts before activating the next window.

When two signals (say, signal 1 and signal 2) are being evaluated, there are thirty-three possibilities for how each evaluation window may be programmed: signals 1 and 2 staying high, signals 1 and 2 staying low, signal 1 staying high and signal 2 staying low, signal 1 staying low and signal 2 staying high, signals 1 or 2 staying high, signals 1 or 2 staying low, signal 1 staying high or signal 2 staying low, signal 1 staying low or signal 2 staying high, signal 1 staying high and signal 2 transitioning from low to high, signal 1 staying high and signal 2 transitioning from high to low, signal 1 staying low and signal 2 transitioning from low to high, signal 1 staying low and signal 2 transitioning from high to low, signal 2 staying high and signal 1 transitioning from low to high, signal 2 staying high and signal 1 transitioning from high to low, signal 2 staying low and signal 1 transitioning from low to high, signal 2 staying low and signal 1 transitioning from high to low, signals 1 or 2 transitioning from high to low, signals 1 or 2 transitioning from low to high, signal 1 transitioning from high to low or signal 2 transitioning from low to high, signal 1 transitioning from low to high or signal 2 transitioning from high to low, signals 1 and 2 transitioning from high to low, signals 1 and 2 transitioning from low to high, signal 1 transitioning from high to low and signal 2 transitioning from low to high, signal 1 transitioning from low to high and signal 2 transitioning from high to low, signal 1 "don't care" and signal 2 staying high, signal 1 "don't care" and signal 2 staying low, signal 1 "don't care" and signal 2 transitioning from high to low, signal 1 "don't care" and signal 2 transitioning from low to high, signal 2 "don't care" and signal 1 staying high, signal 2 "don't care" and signal 1 staying low, signal 2 "don't care" and signal 1 transitioning from high to low, signal 2 "don't care" and signal 1 transitioning from low to high, and, finally, signals 1 and 2 both "don't care".

In general, the user decides on a state that is some Boolean combination of the two signals, and then determines whether the event will consist of leaving that state or arriving at it.

Figure 3:
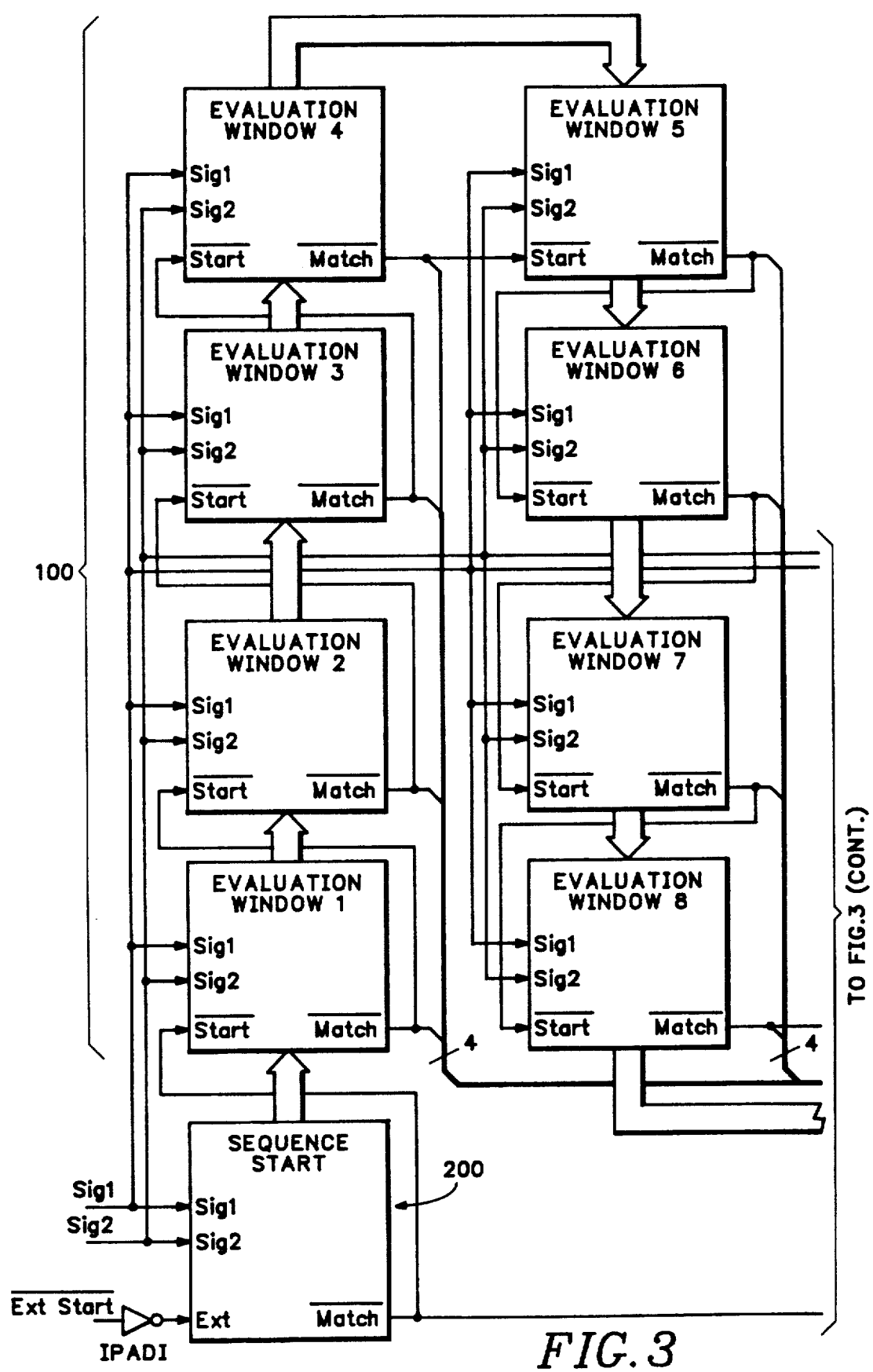
FIG. 3 is a simplified block diagram of a two signal version of the sequence of events detector of the present invention.
Figure 3:
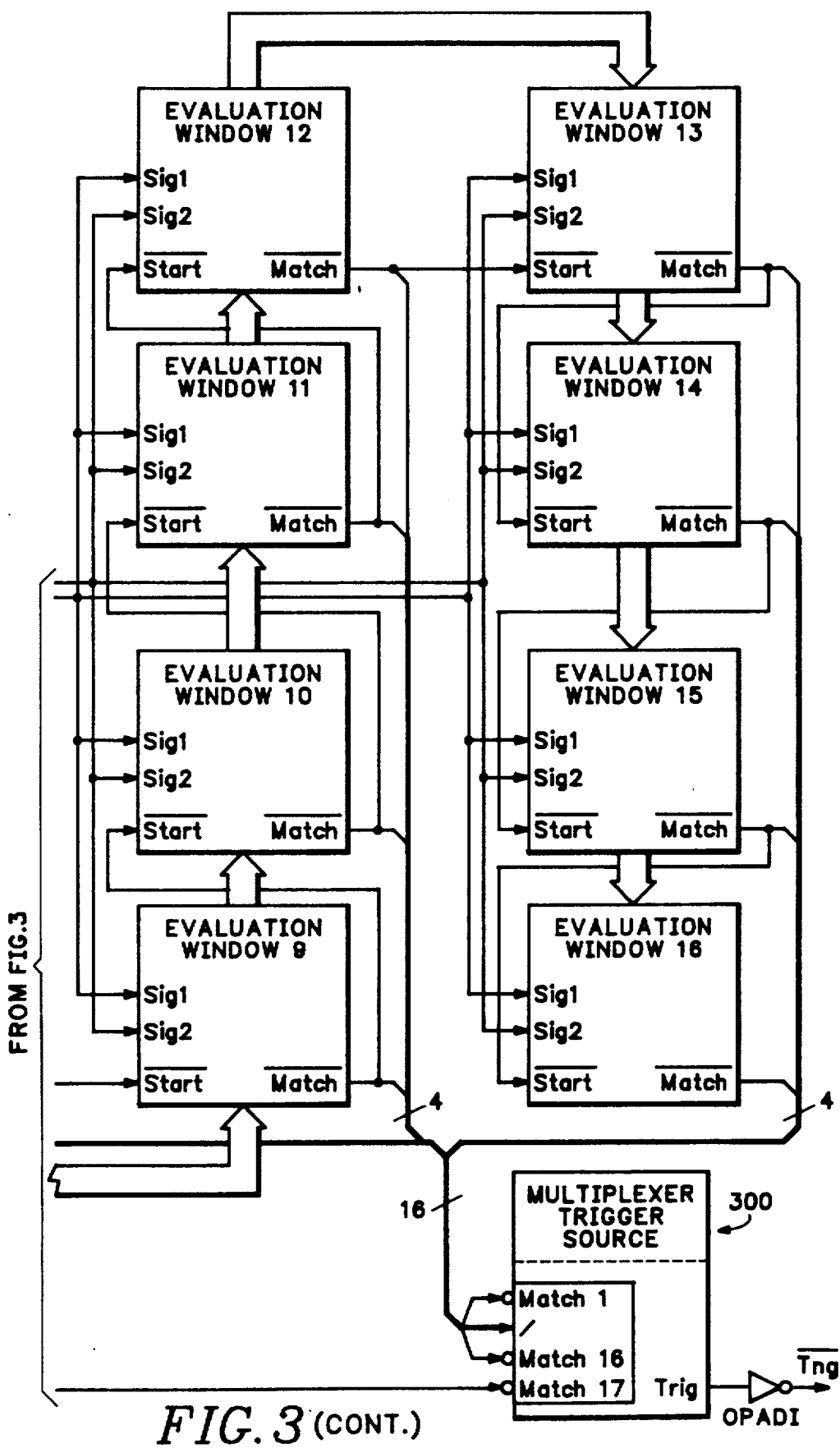

Referring now to FIG. 3, an array 100 of sixteen evaluation windows are connected with their /Match outputs coupled to the /Start inputs of the next window in the series. Each evaluation window monitors both input signals under evaluation, Sig1 and Sig2. The first evaluation window, Evaluation Window 1, is activated by a /Match signal from the Sequence Start circuitry 200, which is also connected to monitor the input signals Sig1 and Sig2 as well as an external start signal /Ext—Start. The /Match outputs of all of the evaluation windows in the array 100 are connected to the inputs of the Multiplexer Trigger Source circuitry 300.

The user specifies criteria for each evaluation window needed to identify a sequence of events, and the sixteen Evaluation Windows in the array 100 are pre-programmed with that information. The user also specifies a starting event, and this information is pre-programmed into the Sequence Start circuitry 200. The starting event may be the /Ext$_{13}$ Start signal, or a rising or falling edge of one of the signals, Sig1 or Sig2, under examination. In the example above, our starting criterion is a "positive-going edge". Since that example only involves one signal, we use Sig1 as that signal and "don't care" Sig2.

When Sig1 next goes positive, the Sequence Start circuity 200 activates its /Match output to notify Evaluation Window 1 that it is now the active window. In a way that will be further described below, the activated Evaluation Window 1 monitors the signals on its Sig1 and Sig2 inputs and applies its pre-programmed criteria.

In this example, the first evaluation window criterion is: "W1 = high for 20 usec." If the Sig1 stays high for the next 20 usec, Evaluation Window 1 produces a /Match active output enabling the next evaluation window, Evaluation Window 2. But, if the next falling edge of Sig1 occurs before the 20 usec has elapsed, Evaluation Window 1 does not produce an active /Match signal, and this evaluation does not produce a match.

Each positive-going edge that appears on Sig1 causes the Sequence Start circuitry 200 to output a /Match signal to the first evaluation window. If the match criterion of Evaluation Window 1 is met, it activates the next window. As long as the activity of the signal under evaluation keeps matching the successive criteria of the evaluation windows, they continue passing the signal evaluation task along to the next window by asserting their /Match output signals and, through them, the /Start inputs of the next stage.

Note that more than one evaluation may be going on simultaneously. If, in a variation on our example above, the signal under evaluation is an unsymmetrical square wave with a 22 usec high portion and a 34 usec low portion, but the criteria are the same as indicated before and illustrated in FIG. 1, each square wave will satisfy the first five evaluation windows, but not the sixth one. Every rising edge causes a /Match output of the Sequence Start circuitry 200, and the first five evaluation windows are each enabled in succession. But, as the high portion of the next cycle of the square wave is satisfying the criterion for Evaluation Window 1 again, that same continuing high signal is violating the criterion for Evaluation Window 6, because the signal does not go low within the specified time.

Figure 4A:
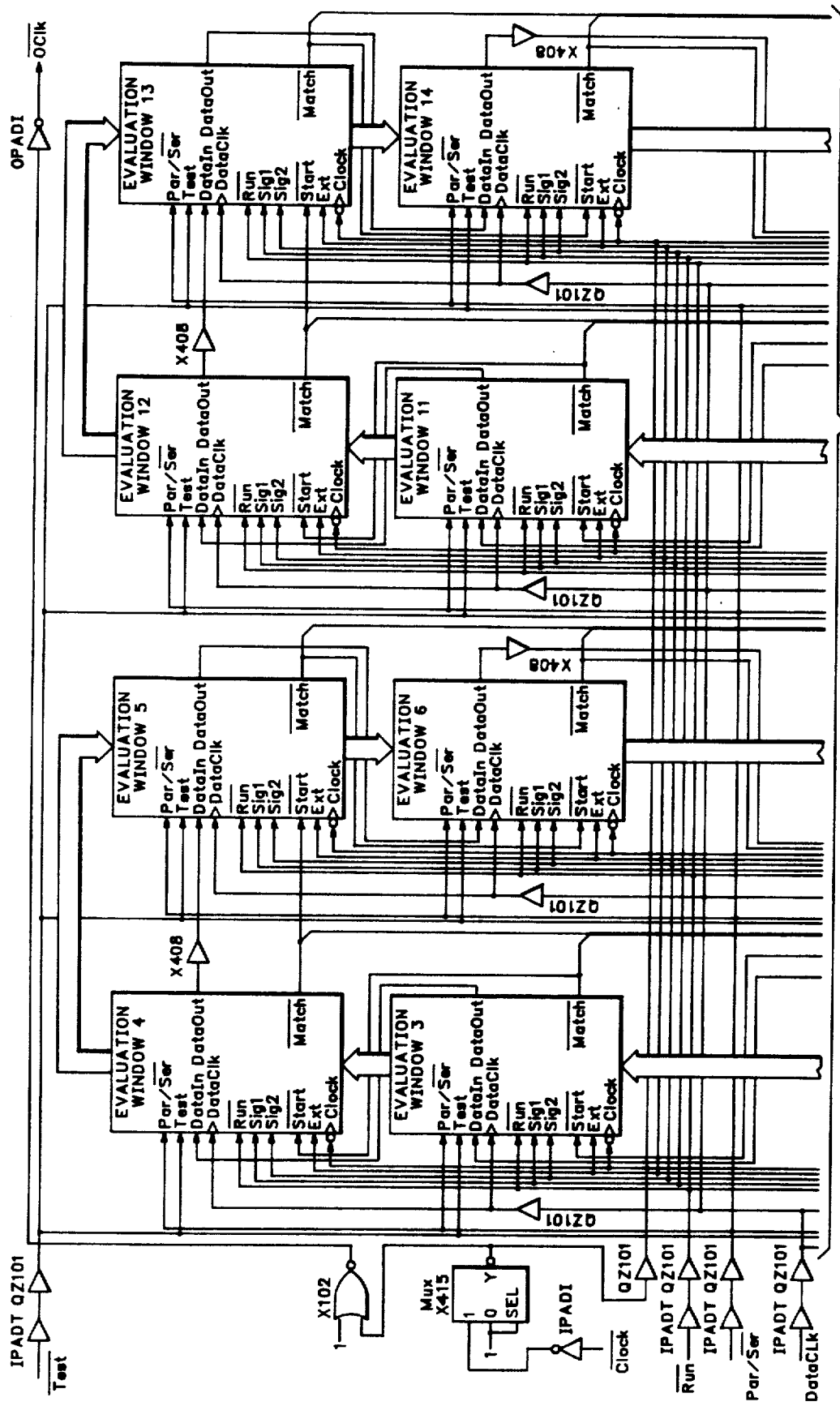
FIGS. 4A, B and C are a detailed block and schematic diagram of the sequence of events detector of the present invention.

FIGS. 4A, B and C show the sequence of events detector of the present invention in full detail at the block diagram level, with some supporting circuitry outside of the main functional blocks shown at the schematic level. The contents of each of the functional blocks is discussed in detail further below; immediately below, the supporting circuitry, and the input and output signals of the overall sequence of events detector, are described.

/Clock is the basic timing clock counted by each evaluation window to keep track of the time that the window is to be active if uninterrupted. /Run enables or disables the overall sequence of events detector. Par/-not-Ser, Dataclk, and DataIn all effect the long serial register that is distributed throughout the major functional blocks to hold the setup and control of the entire detector. When the overall detector is being programmed, Par/not-Ser is low and DataIn is shifted in serially on each active (positive-going) edge of DataClk. Each of the functional blocks has a DataIn and a DataOut that are linked end to end to form the complete shift register chain. This chain is a total of 272 bits long. When Par/not-Ser is high, the states of many internal nodes are loaded into the shift register in parallel on the active edge of DataClk to provide diagnostic information when it is shifted out serially.

As was mentioned above, /Ext—Start is used as one way of activating a waveform evaluation sequence via the Sequence Start circuitry. /Ext—Start also goes to all of the evaluation window blocks, where it is used to start all of the windows at once for diagnostic purposes when this mode of operation is enabled by the signal Test. /TrigClr is used to clear the /Trig output of the Trigger Source Multiplexer circuitry when it is in latch mode, as is further described later.

Figure 4B:
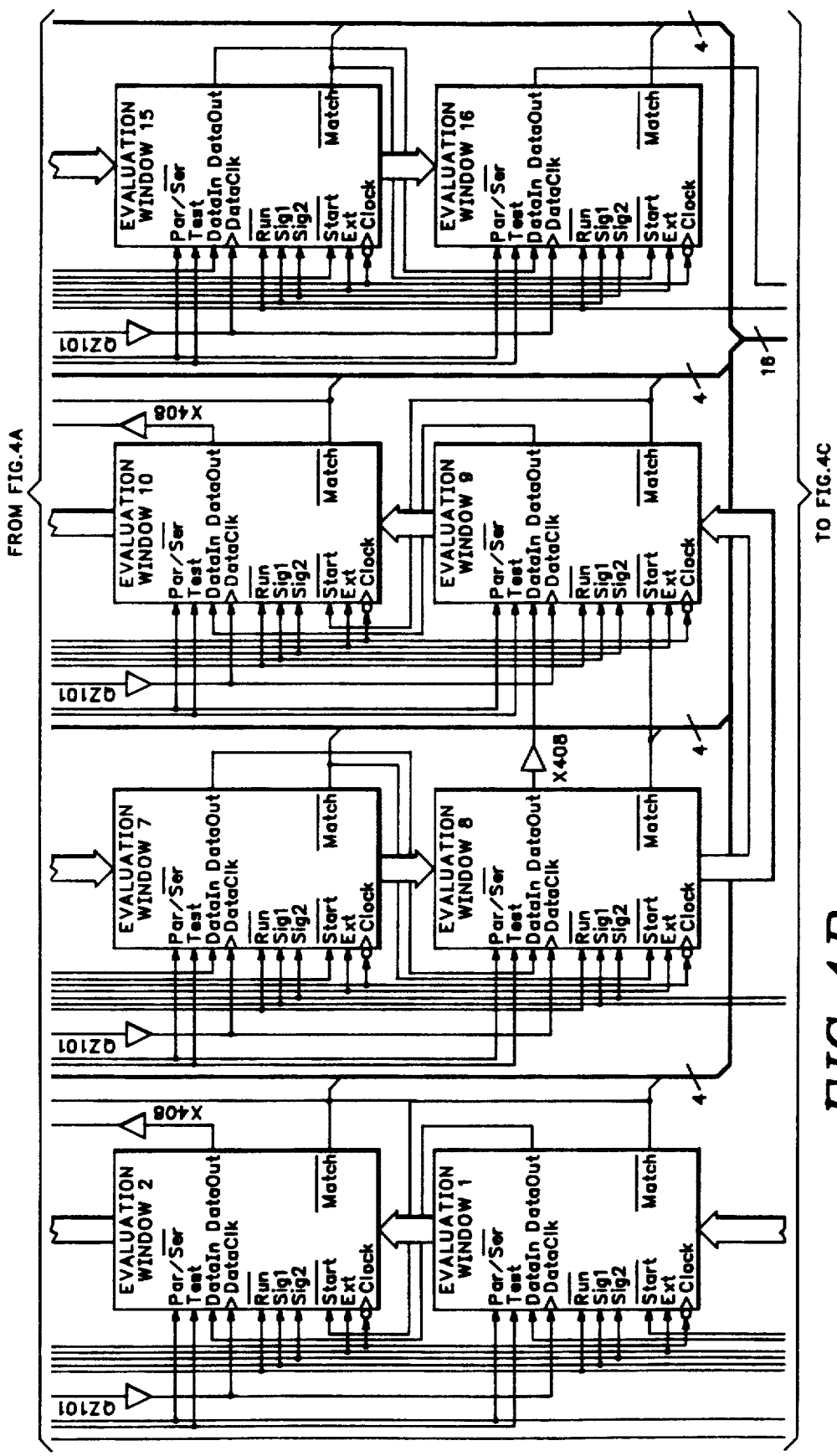
Figure 4C:
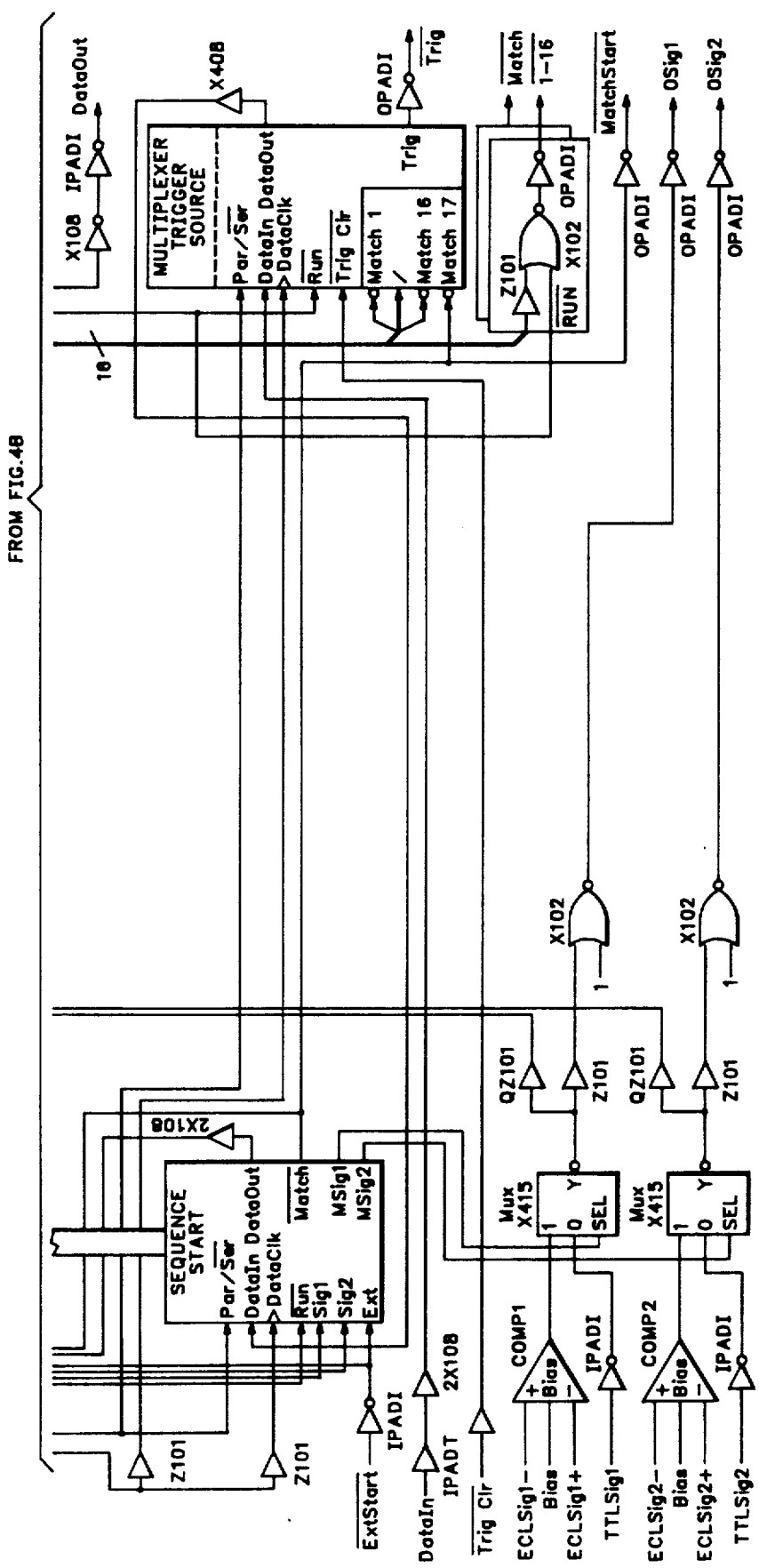

The Sig1 and Sig2 inputs, that are discussed above briefly in connection with FIG. 3, are created by the supporting circuitry shown at the bottom left of FIG. 4C from the input signals ECLSig1−, ECLSig1+, TTLSig1, ECLSig2−, ECLSig2+, and TTLSig2. The ECL versions of each of these signals are converted to TTL by the comparators COMP1 and COMP2 according to the analog Bias signal. The selection between the ECL and TTL sources of these signals is made by multiplexers X415 under the control of the MSig1 and MSig2 signals from the Sequence Start circuitry.

The primary output of the sequence of events detector is /Trig, the end result of a successful sequence detection. The /Match outputs from the Sequence Start circuit and all of the Evaluation Windows are buffered to outputs so they may be used for diagnostic or other purposes. DataOut is the serial output from the end of the 272 bit distributed shift register.

When two or more sequence of events detectors are cascaded, the /Match—16 output from one of them is connected to the /Ext—Start input of the next one. /OClk, OSig1, and OSig2 are suitably delayed versions of /Clk, Sig1, and Sig2, for becoming the /Clock, TTLSig1, and TTLSig2 inputs of the next detector. The DataOut signal from the first detector may also be connected to the DataIn input of the next detector so that two detectors may both be programmed with one long serial stream of data.

Figure 5:
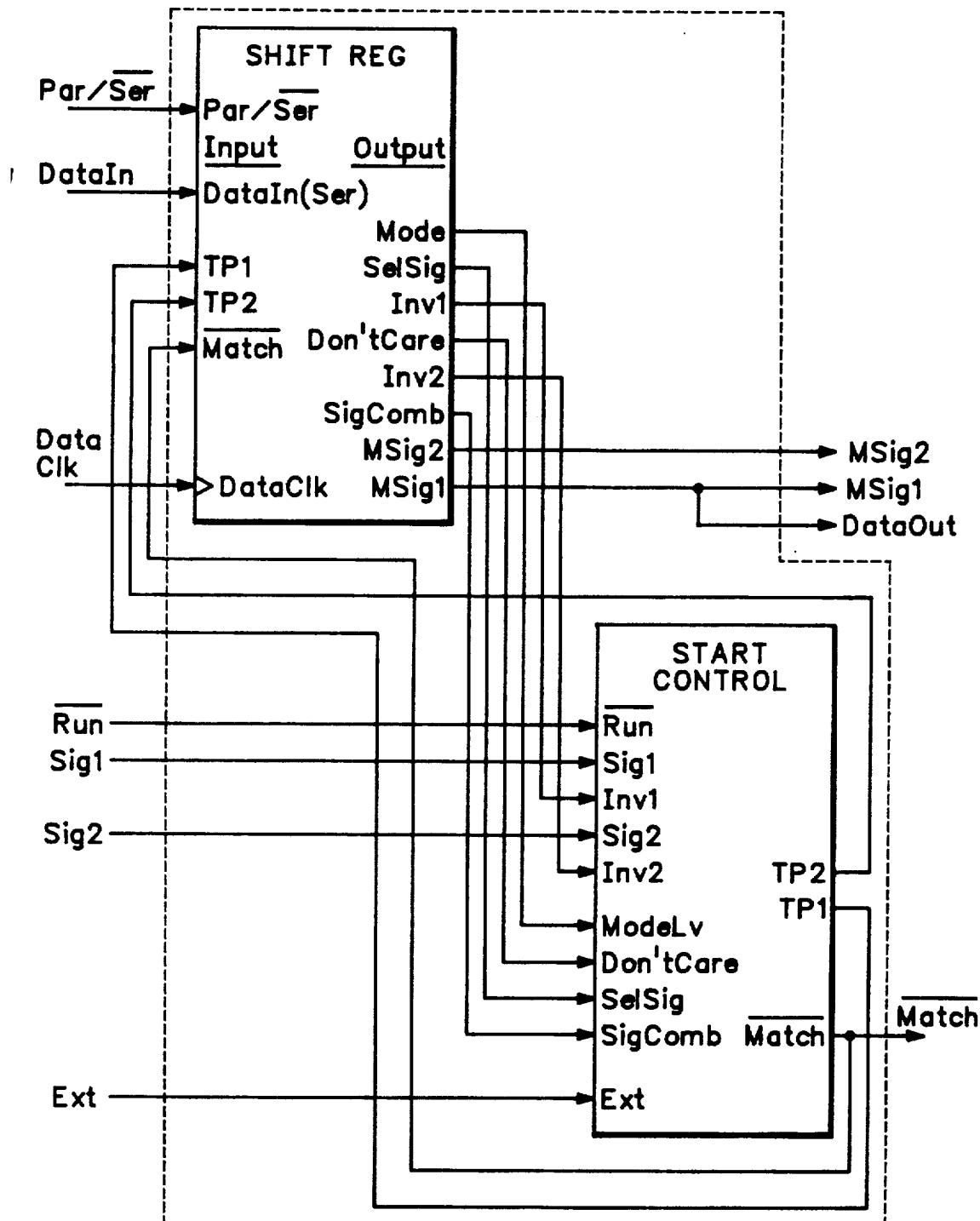
FIG. 5 is a functional block diagram of the sequence start circuit.

Referring now to FIG. 5, the sequence start circuit consists of two major blocks, a shift register block and a start control block. The shift register block receives serial data over the DataIn line during pre-programming operations when Par/not-Ser is low. This data is shifted on counts of the signal DataClk. This shift register is the local portion of the 272 bit distributed shift register that runs through all of the major functional blocks of the sequence of events detector. Six of the outputs of this local portion of the shift register are used by the start control block, while the other two outputs are the MSig1 and MSig2 signals that control Muxes X415 for ECL or TTL selection, as described above. MSig1 serves also as DataOut for connecting this portion of the 272 bit distributed shift register to the next portion during the pre-programming phase of operations, indicated by a low on Par/not-Ser.

Figure 6:
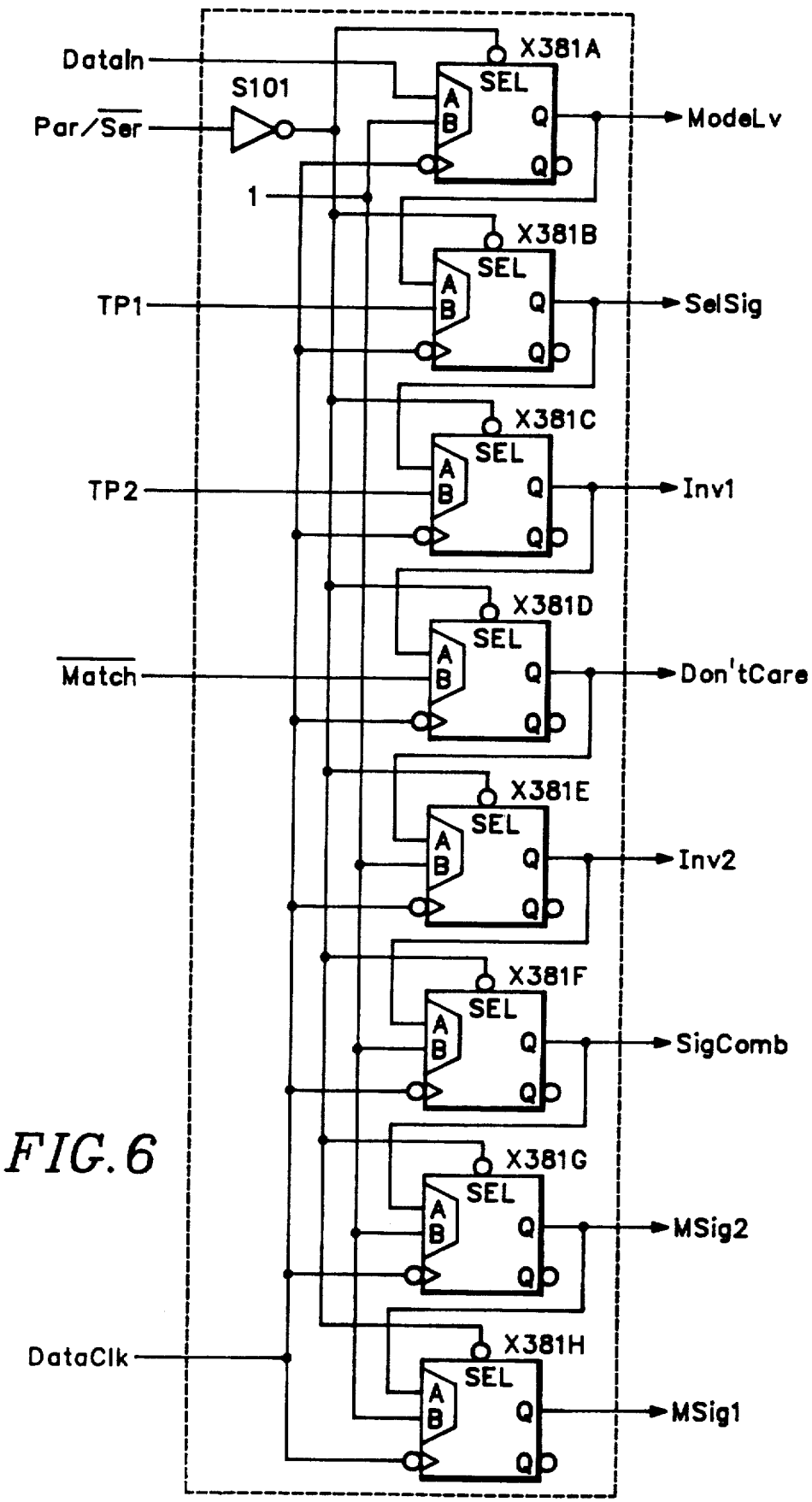
FIG. 6 is a schematic diagram of the shift register block of the start sequence circuitry.

Referring now to FIG. 6, the shift register block of the sequence start circuitry consists of eight flip-flops X381A-X381H with 2:1 multiplexed inputs and one inverting buffer amplifier on the Par/not-Ser input. A low on the Par/not-Ser input to this block is inverted by this buffer amplifier to apply a high to the inverting SEL input of these flip-flops, putting their input multiplexers in the A position so that the shift register is in its serial mode of operation and the data loaded is the Q output of the previous flip-flop in the shift register. The first flip-flop X381A receives its serial input from DataIn and, referring to FIG. 5, the MSig1 output is also connected to the DataOut output which, referring to FIG. 4, is connected to the DataIn input of Evaluation Window 1. When Par/not-Ser is high, the input multiplexers of the flip-flops X381A-X381H have their B inputs enabled and TP1, TP2, and /Match data are loaded into the second, third, and fourth bits respectively by the DataClk signal.

Figure 7:
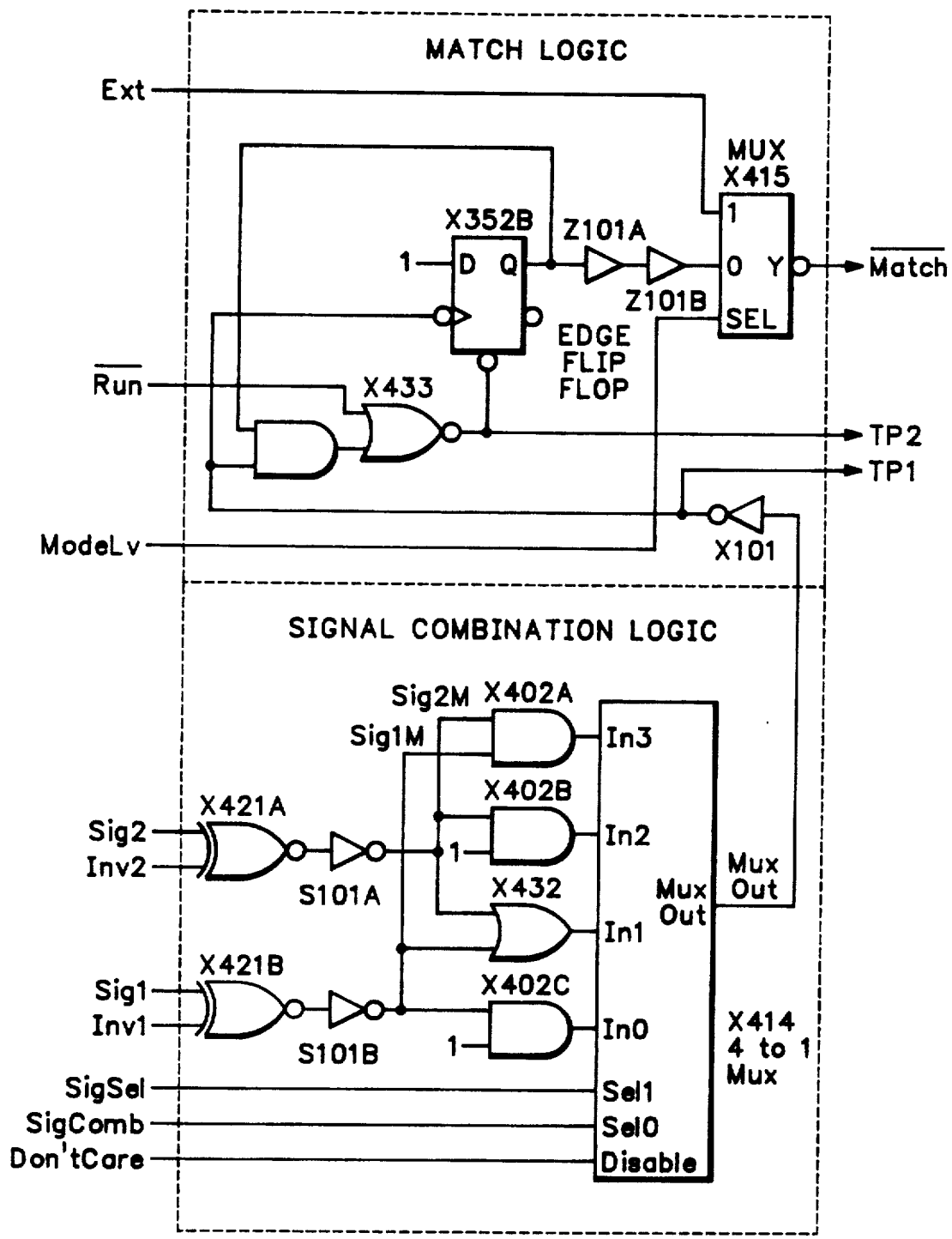
FIG. 7 is a schematic diagram of the start control block of the start sequence circuitry.

Referring now to FIG. 7, the start control block of the sequence start circuitry produces a valid /Match signal when the correct state of the Ext signal or combination of Sig1 and Sig2 occurs. The multiplexer Mux X415 produces the /Match signal from one of two sources, depending on the state of the ModeLv. When ModeLv is high, /Match is caused by the Ext signal, whereas when ModeLv is low, /Match is caused by the output of the Edge Flip-Flop X352B. In the first case, /Match goes active (0) when Ext goes true (1) and goes inactive (1) when Ext goes false (0). In the second case, /Match goes active (0) when the Edge Flip-Flop X352B is clocked true (1) and goes inactive (1) when the flip-flop is cleared.

The Edge Flip-Flop X352B is always cleared while /Run is high, since NOR gate X433 passes and inverts that high into a low that clears the flip-flop when applied to its reset input. When /Run is low, the output of the Signal Combination Logic in the bottom half of FIG. 7 determines the operation of the Edge Flip-Flop X352B. The Edge Flip-Flop X352B has a hard wired high (1) units D input and is clocked true by the high-going edge of MuxOut from the 4-to-1 multiplexer X414. The Edge Flip-Flop X352B is then cleared when both MuxOut goes low and the Q output becomes high, whichever happens last. The feedback from the Q output around to the reset input ensures a minimum pulse duration on the /Match output.

The Signal Combination Logic at the bottom of FIG. 7 selects the combination of Sig1 and Sig2 that causes MuxOut to go true. In general, the user decides on a state that is some Boolean combination of the two signals, and then determines whether the event will consist of leaving that state or arriving at it.

The possible signal combinations that may be selected are: signals 1 or 2 transitioning from high to low, signals 1 or 2 transitioning from low to high, signal 1 transitioning from high to low or signal 2 transitioning from low to high, signal 1 transitioning from low to high or signal 2 transitioning from high to low, signals 1 and 2 transitioning from high to low, signals 1 and 2 transitioning from low to high, signal 1 transitioning from high to low and signal 2 transitioning from low to high, signal 1 transitioning from low to high and signal 2 transitioning from high to low, signal 1 "don't care" and signal 2 transitioning from high to low, signal 1 "don't care" and signal 2 transitioning from low to high, signal 2 "don't care" and signal 1 transitioning from high to low, signal 2 "don't care" and signal 1 transitioning from low to high.

The desired signal combination occurs in three stages. The first of these stages is the exclusive-NOR gates X421A and X421B which control the polarity of the signals according to the states of Inv1 and Inv2. The polarity of the input signals Sig1 and Sig2 is inverted when the corresponding inversion control signals Inv1 and Inv2 are high. That is, Sig1M will be an inverted version of Sig1 when Inv1 is high, and a non-inverted version when Inv1 is low. Similarly, Sig2M will be an inverted version of Sig2 when Inv2 is high, and a non-inverted version when Inv2 is low.

The second stage of signal combination arises from the operation of AND gates X402A, B, and C and OR gate X432. The two AND gates X402B and X402C that have one input tied to a logical one (1) merely provide a gate-delayed version of Sig1M and Sig2M, while the other AND gate X402A provides the logically ANDed version of the two signals Sig1M and Sig2M. The OR gate X432 provides a logically ORed version of the two signals Sig1M and Sig2M.

All four of these versions of the signals are inputs to the third stage of signal combination, multiplexer X414. The SigSel and SigComb signals control the operation of the multiplexer X414 in putting one of these four inputs on its output MuxOut, according to the following table:

| SIGNAL COMBINATION LOGIC | | | | | |
|---|---|---|---|---|---|
| Sig Comb | Sig Sel | Sig 1M | Sig 2M | Mux Out | Logic Mode |
| 0 | 0 | 0 | X | 0 | Sig1M |
| 0 | 0 | 1 | X | 1 | Sig1M |
| 0 | 1 | X | 0 | 0 | Sig2M |
| 0 | 1 | X | 1 | 1 | Sig2M |
| 1 | 0 | 0 | 0 | 0 | Sig1M OR Sig2M |
| 1 | 0 | 1 | 0 | 1 | Sig1M OR Sig2M |
| 1 | 0 | 0 | 1 | 1 | Sig1M OR Sig2M |
| 1 | 0 | 1 | 1 | 1 | Sig1M OR Sig2M |
| 1 | 1 | 0 | 0 | 0 | Sig1M AND Sig2M |
| 1 | 1 | 1 | 0 | 0 | Sig1M AND Sig2M |
| 1 | 1 | 0 | 1 | 0 | Sig1M AND Sig2M |
| 1 | 1 | 1 | 1 | 1 | Sig1M AND Sig2M |

The Don'tCare signal disables the multiplexer altogether, so that MuxOut is always false (0).

Figure 8:
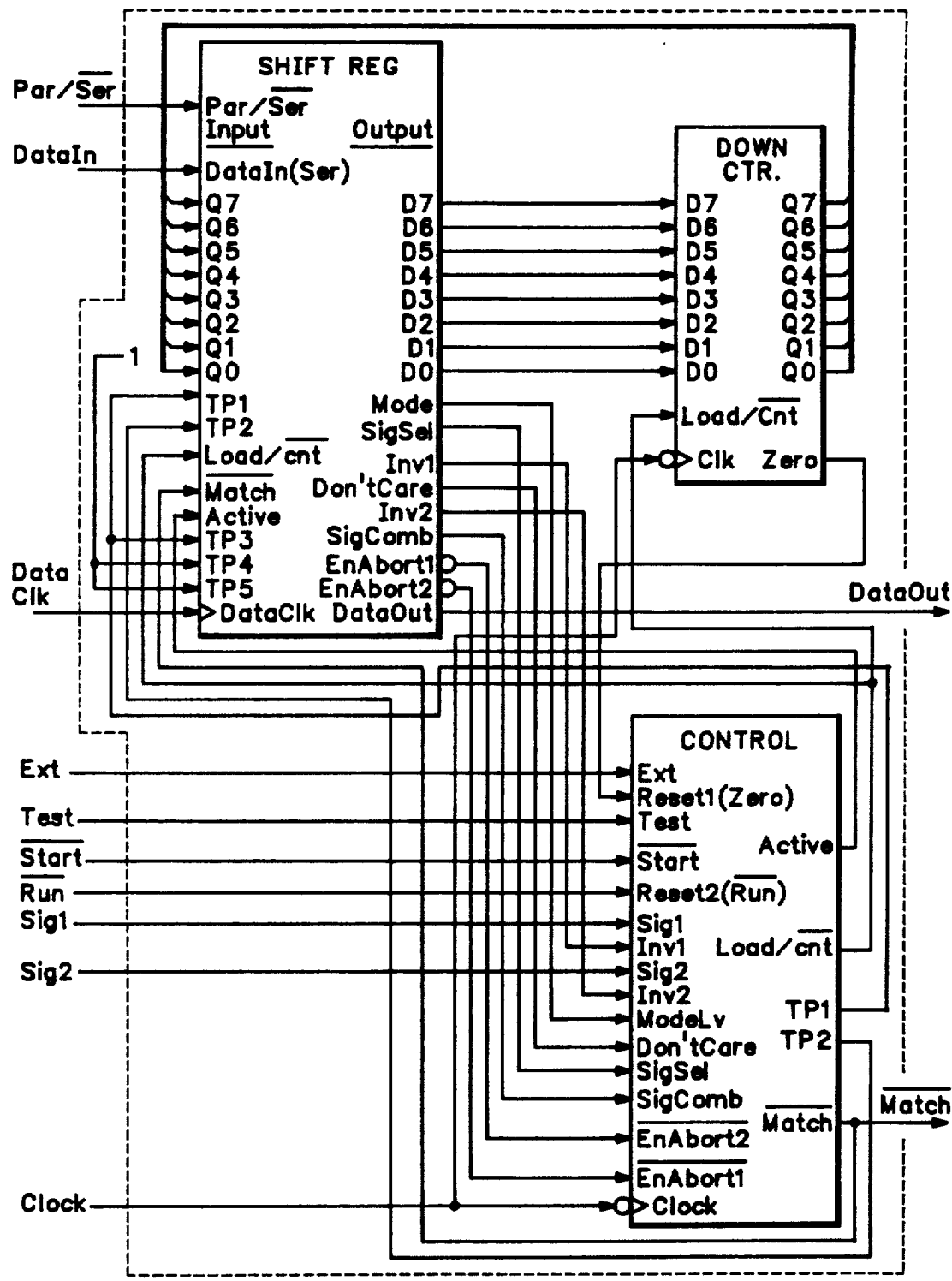
FIG. 8 is a block diagram of the evaluation window circuit.

Referring now to FIG. 8, each of the sixteen evaluation window circuits contains a Shift Register circuit, a Down Counter circuit, and a Control circuit. The evaluation windows monitor the signals Sig1 and Sig2 during a period of time determined by the operation of the Down Counter to produce a /Match output when the programmed conditions are satisfied.

If a window is programmed to look for a level, it generates a /Match signal at the end of the programmable time period if the level persists for that long. If the level changes before the time period is up, no /Match signal is generated and the counter is reset to wait for another /Start signal.

If a window is programmed to look for an edge, it generates a /Match signal as soon as that edge occurs. If the edge does not occur within the time interval, it does not generate a /Match and the counter is reset to wait for another /Start signal when the time interval expires. Evaluation windows can also be given a "don't care" criterion, in which case they produce a /Match signal when the programmed time interval expires no matter what the activity of the signals Sig1 and Sig2 has been during that interval.

Figure 9:
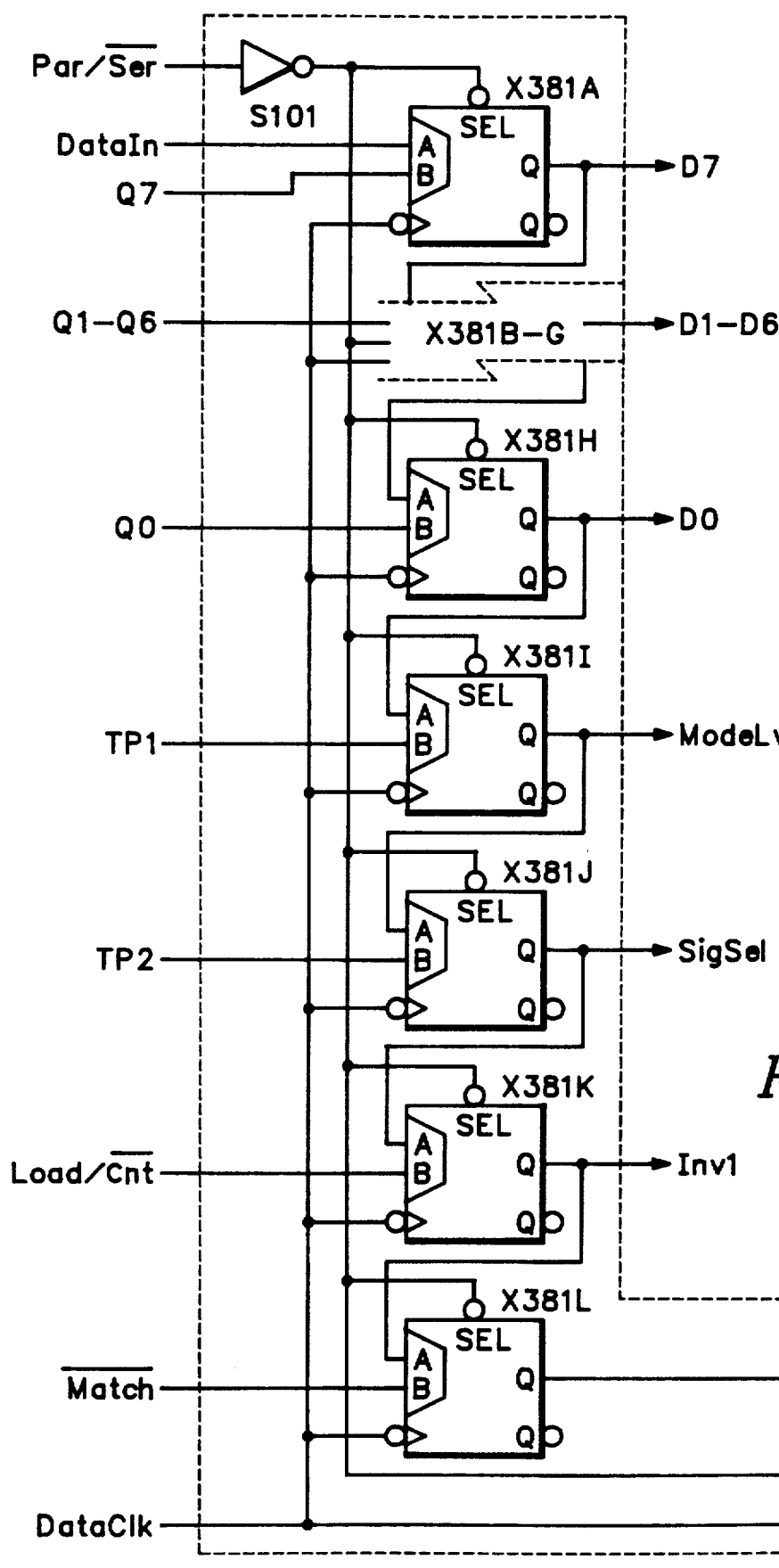
FIG. 9 is a schematic diagram of the evaluation window shift register circuit.
Figure 9:
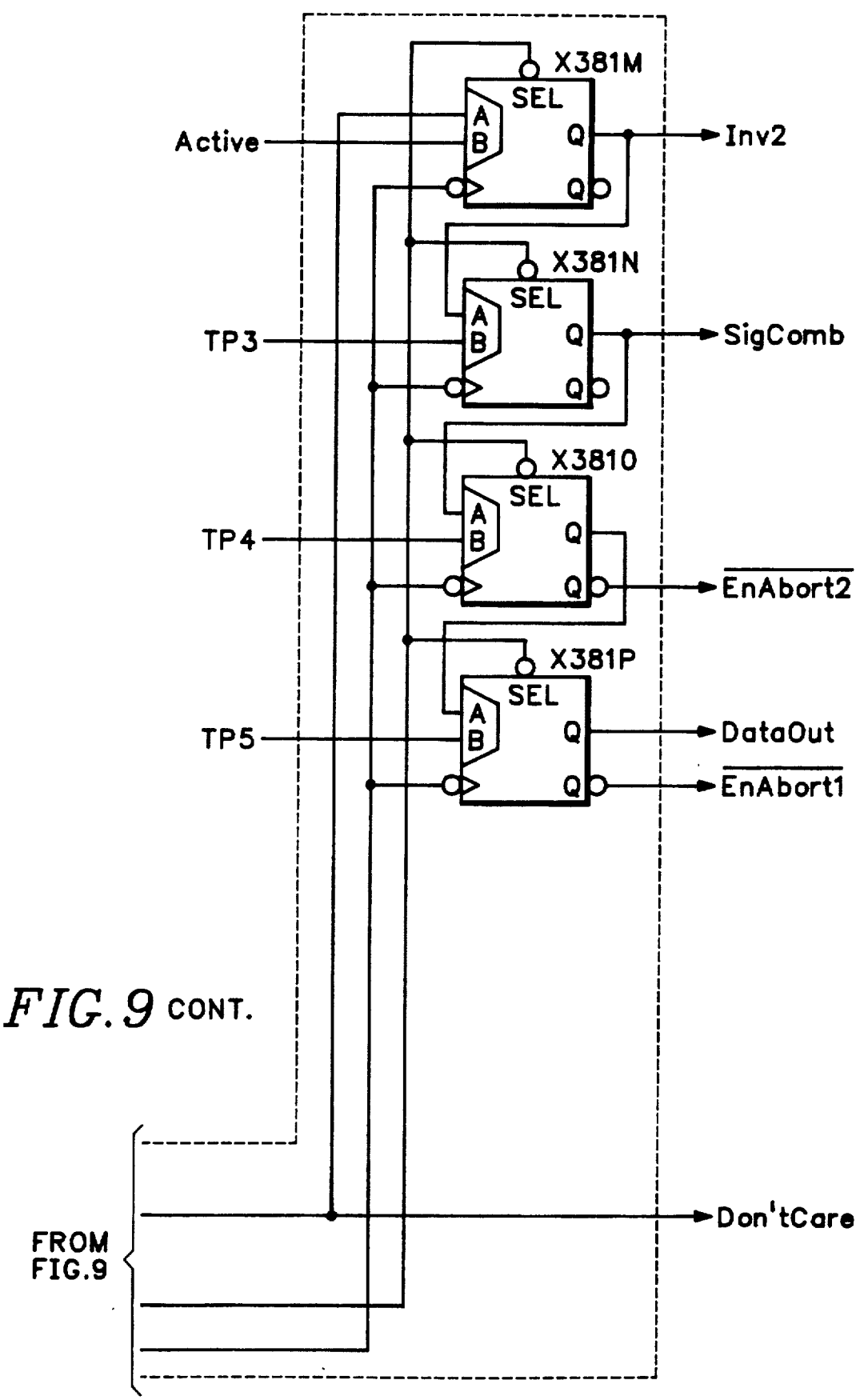

Referring to FIGS. 8 and 9, the Shift Register circuit of the evaluation windows is sixteen bits long. Except for this difference in length, it operates identically with the shift register circuitry described above for the Sequence Start circuit. Eight of these bits are, as before, control information for the Control circuit. The extra eight bits are used to program the Down Counter with window duration information. As before, the shift register comprises flip-flops X381A-X381P with 2-to-1 multiplexer inputs. One of the inputs to these multiplexers is the output of the preceding flip-flop, while the other one is local status information for diagnostic readback.

Figure 10:
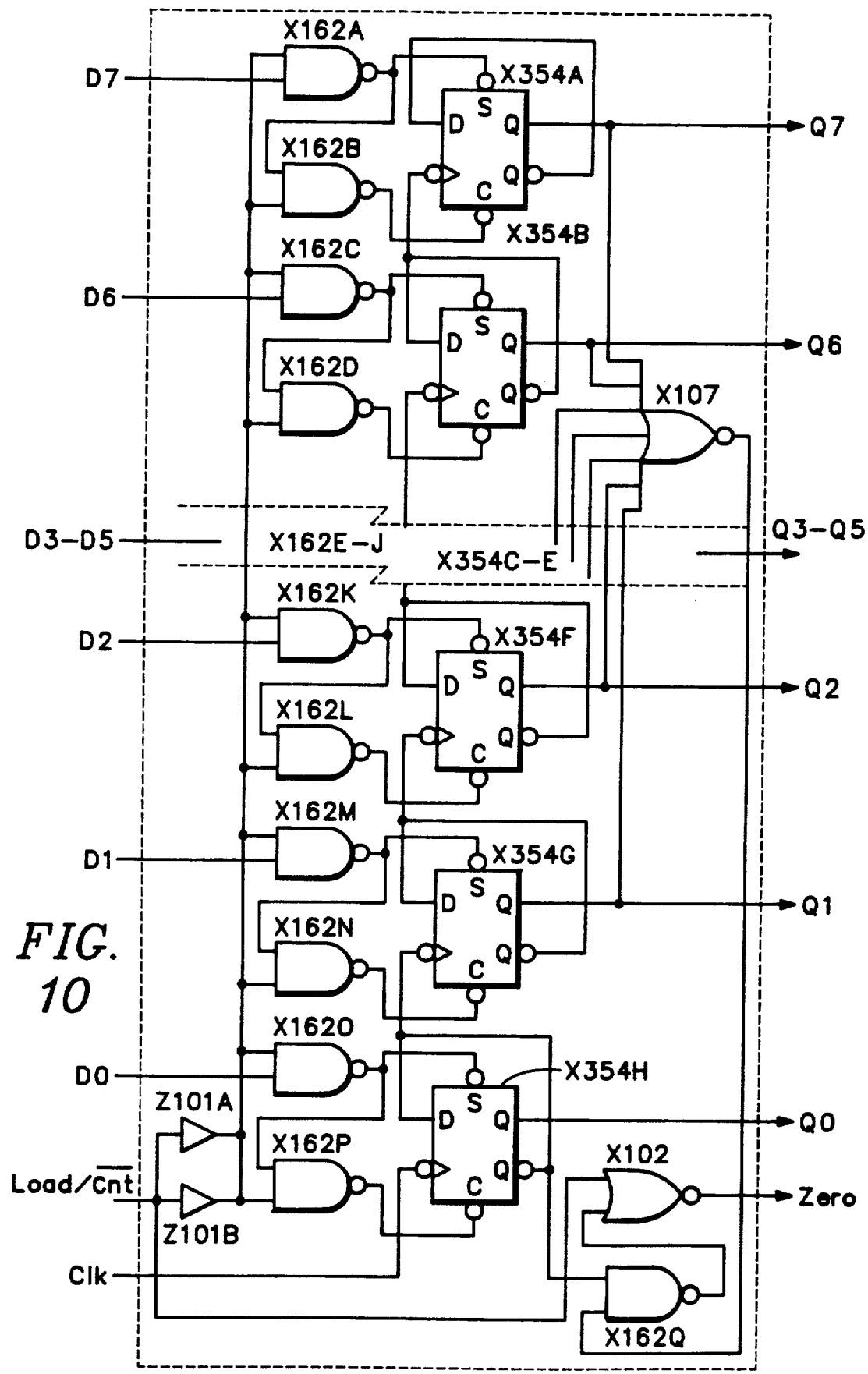
FIG. 10 is a schematic diagram of the evaluation window down counter circuit.

Referring to FIGS. 8 and 10, the Down Counter of the evaluation windows is an 8-bit ripple down counter with asynchronous preset that is loaded with initial values by the eight data lines D0-D7 from the Shift Register. When Load/not-Cnt is high, all of the NAND gates X162A,C,E,G,I,K,M and O are enabled so as to pass the load data to the set inputs of the D-type flip-flops X354A-X354H that comprise the counter. The inverses of the data area also applied to the clear inputs of the flip-flops X354A-X354H by additional NAND gates X162B,D,F,H,J,L,N and P.

When Load/not-Cnt is low, the Zero output is enabled via NOR gate X102 and the counter is allowed to decrement on each negative edge of the Clock signal. The output of NOR gate X107 goes high when all of the bits except Q0 are low, and its output enables one side of NAND gate X162Q. When the least significant bit Q0 also reaches zero, the other input to NAND gate X162Q goes high producing a low on the output of that gate. With Load/not-Cnt low, this low produces a high on the Zero output, informing the Counter Control that the counter has timed out. If Load/not-Cnt goes high before the counter reaches zero, the Zero output is disabled by that high on the input to NOR gate X102 and the counter loads D0-D7.

Figure 11:
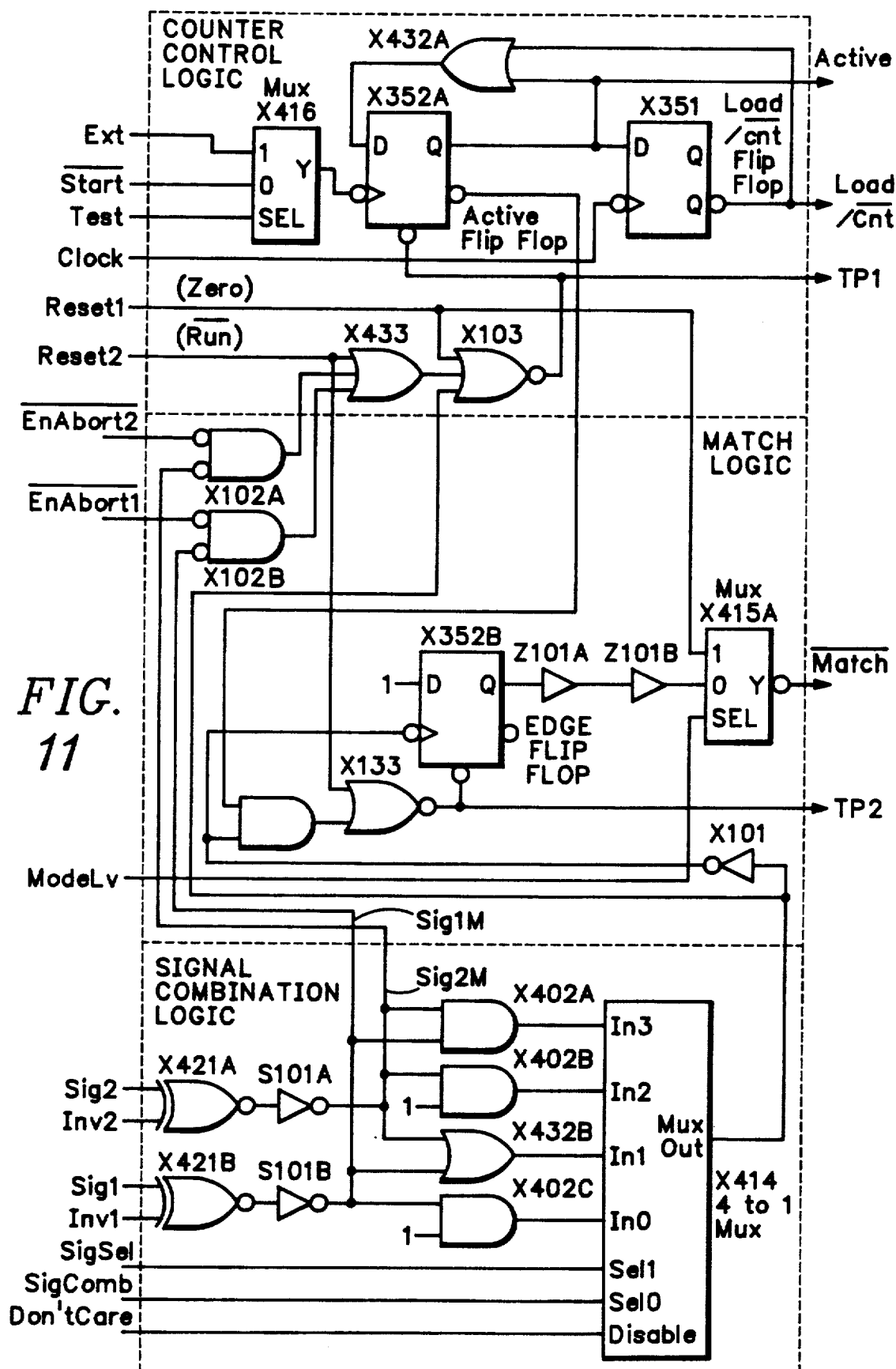
FIG. 11 is a schematic diagram of the evaluation window control circuit.

Referring to FIGS. 8 and 11, the Control circuit for the evaluation window, when active, evaluates Sig1 and Sig2 according to programmable criteria and produces an active /Match signal if the criteria are met. The Control circuitry consists of threes parts: Counter Control Logic, Match Logic, and Signal Combination Logic.

Figure 12:
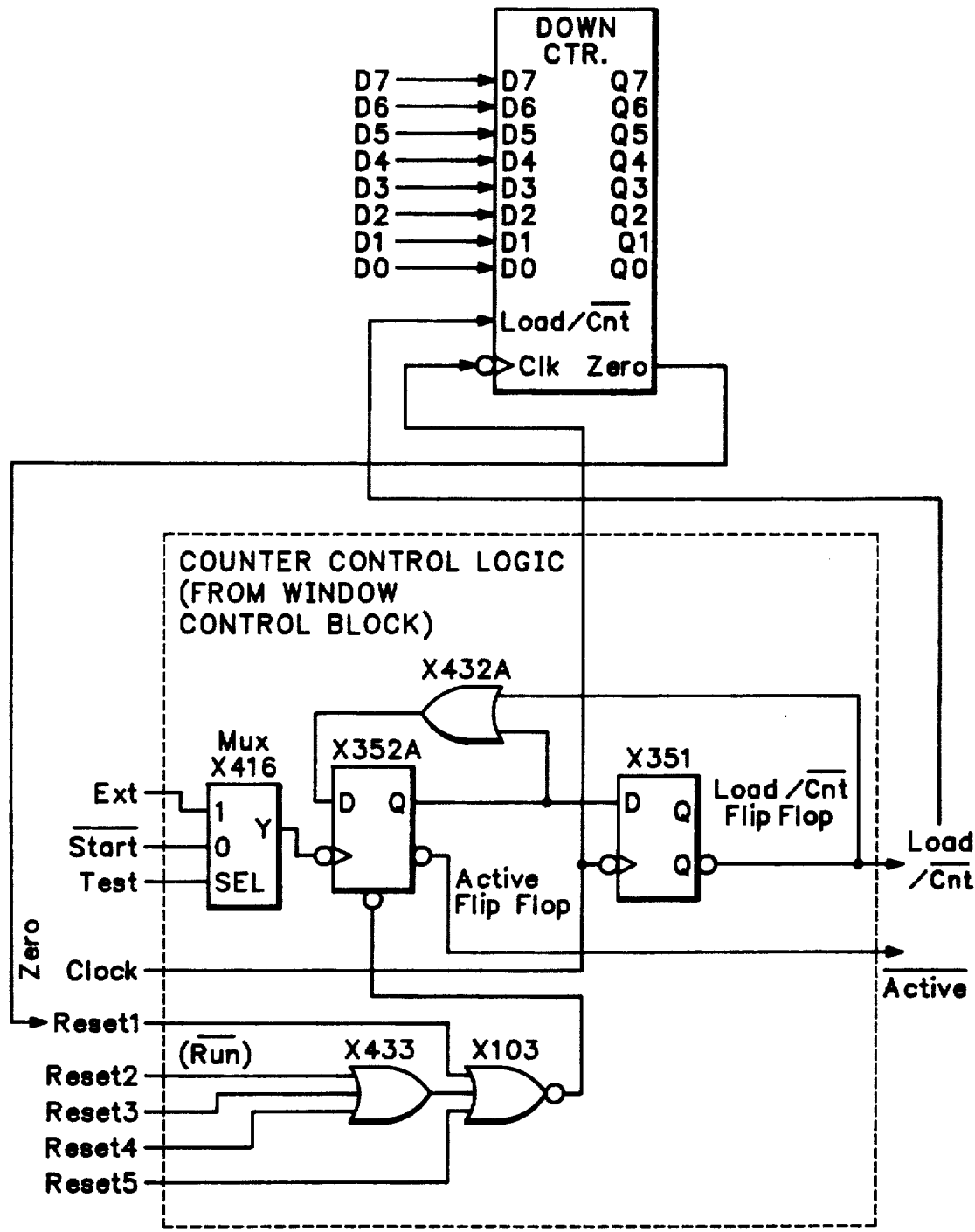
FIG. 12 is a schematic diagram of the counter control logic.

Referring to FIG. 12, the Counter Control Logic in combination with the Down Counter creates a resetable, but non-retriggerable, digital one shot with programmable delay. In normal operation when Test is low, /Start triggers this one shot. The one shot resets when Zero Activates Reset1 or when any of the other reset signals are activated. The one shot delay is determined by the Down Counter's preset value when /Start goes from high to low. A preset value of zero allows /Active to be true for a maximum duration of about one Clock period, while a count of 255 permits /Active to be active for up to about 256 Clock periods after /Start. This period can be cut short by any reset signal.

When the signal Test is inactive, the 0 input of Mus X416 is the operative input, and high to low transition of /Start sets the Active Flip-Flop X352A if the D input is high. When Test is high, the activity of the Counter Control Logic is initiated by the External signal. In either event, the D input of the Active Flip-Flop X352A is high when Load/not-Cnt is high or when the Active Flip-Flop is already set. Thus, a second /Start transition from high to low while the window is already active has no effect, permitting the window to continue with its evaluation rather than being retriggered.

The Load/not-Cnt Flip-Flop X351 synchronizes the Active signal with the next Clock signal, producing the Load/not-Cnt signal that activates the Down Counter. The Active Flip-Flop X352A is cleared by any one of the five reset lines, Reset1, Reset2, Reset3, Reset4, and Reset5. The Zero signal from the Down Counter is connected to Reset1, causing the Active Flip-Flop X352A to reset when the Down Counter reaches its terminal count. When this occurs, the change in the Active signal is again sychronized with the Clock signal by the Load/not-Cnt Flip-Flop X351 and the resulting high on the Load/not-Cnt line puts the Down Counter back into the load mode. /Run, the disable signal for the whole sequence of events detector, is connected to Reset2. The other three reset lines are connected to outputs of the Signal Combination Logic in ways which are described below.

Figure 13:
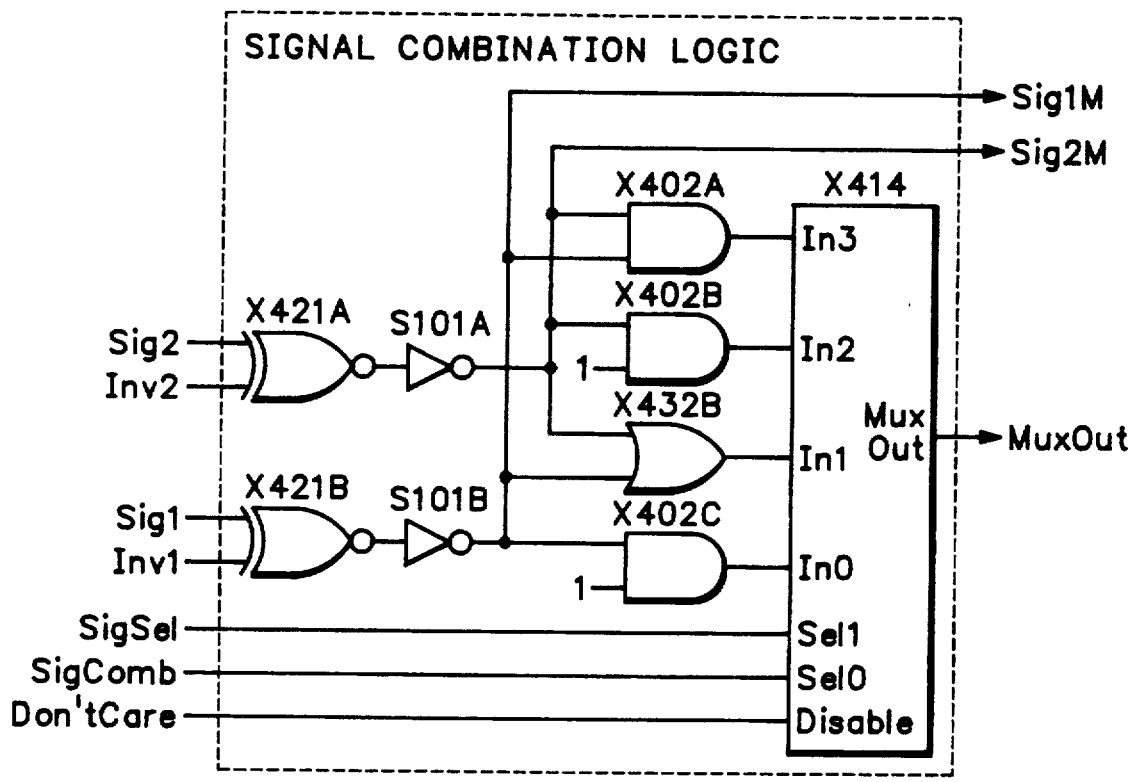
FIG. 13 is a schematic diagram of the signal combination logic.

Referring to FIG. 13, the Signal Combination Logic of the evaluation windows operates exactly the same as the Signal Combination Logic described above for the Start Sequence circuitry. Here, as there, its function is to select the combination of Sig1 and Sig2 that will cause MuxOut to go true. The MuxOut signal is used by the Match Logic, discussed below, to determine whether of not /Match should go true in many of the evaluation window modes of operation. The Sig1M and Sig2M signals are also used by other portions of the Window Control circuitry, as explained below. The Signal Combination Logic is used in all modes except "don't care". When Don'tCare is high, the MuxOut signal is disabled. Refer to the Signal Combination Logic table provided earlier for the conditions that produce the MuxOut signal.

Referring to the center portion of FIG. 11, the Match Logic generates an active /Match signal under the correct conditions for every mode of operation of the evaluation windows. It also generates resets for the Counter Control Logic in certain modes of operation of the evaluation windows.

The /Match output is multiplexed from one of two sources by Mux X415 under the control of the signal ModeLv. When ModeLv is high, the Reset1 signal from the Counter Control Logic, which is really the Zero signal from the Down Counter, produces the /Match signal. When ModeLv is low, the output of the Edge Flip-Flop X352B produces the /Match signal. The operation of the Match Logic is explained below in terms of four main modes of operation: "don't care" mode, "level" mode, "either or both edges" mode, and "specific edge" mode.

Figure 14:
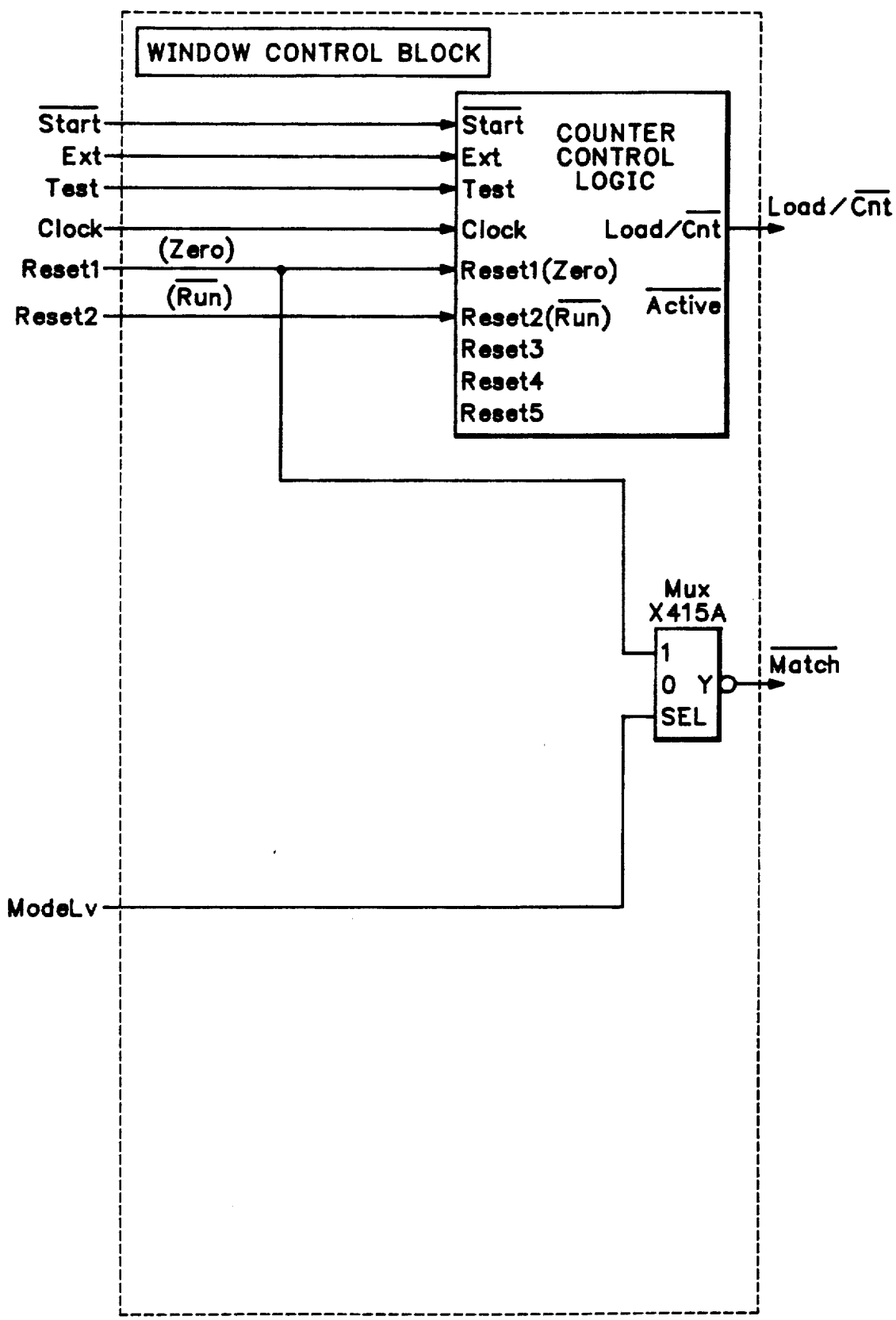
FIG. 14 is a diagram of the match logic in the "don't care" mode.

Referring to FIGS. 11 and 14, in the "don't care" mode a high level on the ModeLv signal selects the Zero Signal from the Down Counter as the /Match output through Mux X415A, and the Window Control block acts as a non-retriggerable one shot, staying active after /Start for a preset time regardless of the activity of Sig1 and Sig2. A low-going edge of /Start causes /Active to go active (low). On the next active edge (low-going) of the Clock, Load/not-Cnt goes active (low) enabling the Down Counter. When the count reached zero, Zero goes active (high) causing /Match to go active (low) and the Active Flip-Flop X352A to reset. Load/not-Cnt then goes high on the next active (low-going) edge of Clock, putting the Down Counter into the load mode.

Figure 15:
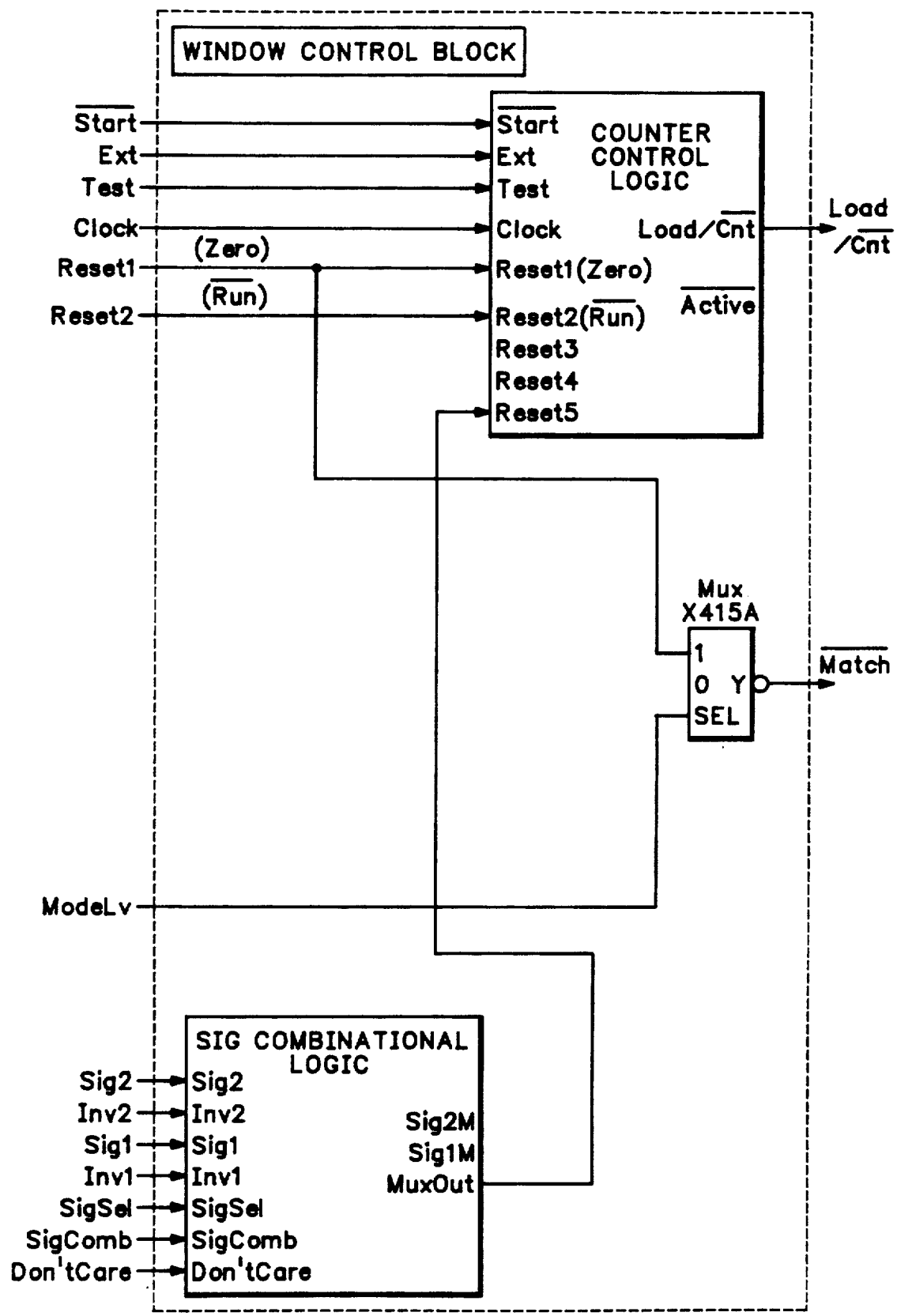
FIG. 15 is a diagram of the match logic in the "level" mode.

Referring to FIGS. 11 and 15, in the "level" mode the Window Control circuitry checks that Sig1 and/or Sig2 maintain a specified state for the entire window time period following an active edge (low-going) on the /Start signal. This mode is similar to the "don't care" mode, except for one additional means of resetting the Counter Control Logic.

In "level" mode, an active (high) MuxOut from the Signal Combination Logic resets the Active Flip-Flop X352A in the Counter Control Logic via Reset5. The Boolean combination of Sig1 and Sig2 that describes "NOT the desired state" is selected as the MuxOut signal from the Signal Combination Logic. If this state occurs, the window is terminated by Reset5 and no active (low) /Match signal is generated and the pattern detection chain is broken.

As an example of operation in the "level" mode, suppose that the desired condition for a particular evaluation window is that both signals remain high throughout the window time interval. Inv1, Inv2, and SigComb would be high, while SigSel and Don'tCare would be low. The high levels on Inv1 and Inv2 cause Sig1M and Sig2M to be inverted versions of Sig1 and Sig2. The high on SigComb and low on SigSel mean that the MuxOut signal will occur for /Sig1 OR /Sig2, that is, NOT (Sig1 AND Sig2). Refer to the Signal Combination Logic table provided above. Thus, MuxOut will be low for as long as both Sig1 and Sig2 remain high, as the Window Control circuitry executes the programmable one-shot function described for the "don't care" mode.

Figure 16:
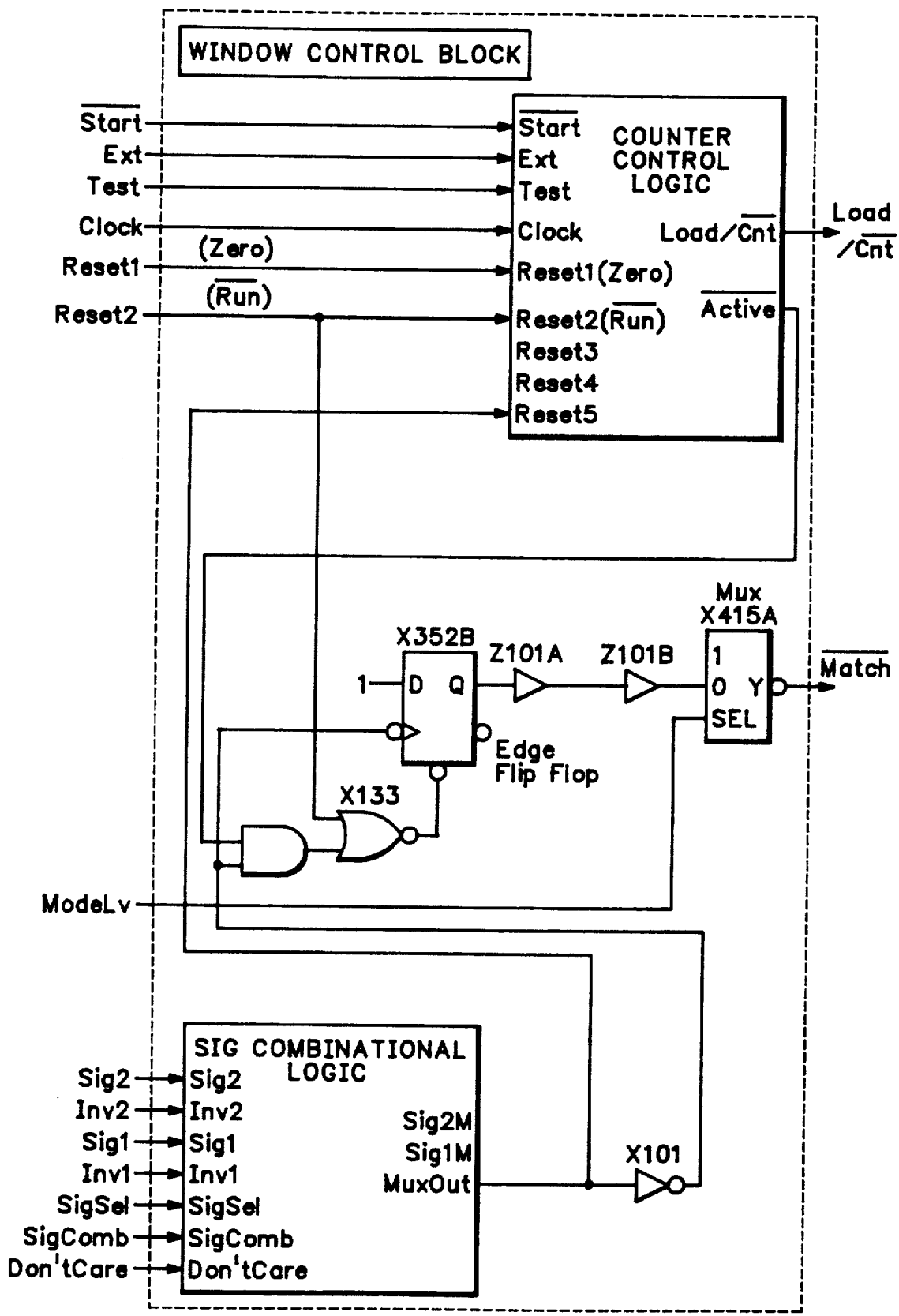
FIG. 16 is a diagram of the match logic in the "either or both edges" mode.

Referring to FIGS. 11 and 16, in the "either or both edges" mode ModeLv is low causing Mux X415A to use the output of the Edge Flip-Flop X352B as the basis for the /Match signal. The Edge Flip-Flop X352B is set by a low-going edge of the signal /MuxOut, an inverted version of MuxOut, when /Active is low indicating that the window is active. As in the "level" mode, the Signal Combination Logic is set up to respond to the Boolean combination of Sig1 and Sig2 that describes "NOT the desired state". Thus, when the inputs depart from their expected conditions while the window is active, MuxOut is generated and the edge of that transition sets the Edge Flip-Flop X352B and resets the Active Flip-Flip X352A. The Edge Flip-Flop X352B is cleared when the MuxOut signal returns to low and /Active is high, as it becomes when the Active Flip-Flop resets. Relying on both MuxOut and /Active to clear the Edge Flip-Flop X352B assures a minimum pulse width for the /Match signal's active period. The Edge Flip-Flop X352B is also cleared by a high condition of the /Run signal, indicating that the whole sequence of events detector has been disabled. If neither signal changes, Zero ultimately occurs and the Active Flip-Flop resets without generating a /Match.

If the window in inactive, that is /Active high, and MuxOut goes high, it would appear that the Edge Flip-Flop X352B is being clocked to a set condition at the same time that its clear is being released. Actually, however, the clock precedes the clear by two gate delays, which is sufficient to prevent the Edge Flip-Flop X352B from being set when this occurs.

To illustrate an example setup in the "either or both edges" mode, assume the initial condition of Sig1 and Sig2 to be high, and that the operator wishes to generate a /Match active (low) signal if either signal changes state. The Signal Combination Logic setup is the same as that for our last example in the "level" mode, that is, Inv1, Inv2, and SigComb will be high, while SigSel and Don'tCare are low. The high levels on Inv1 and Inv2 cause Sig1M and Sig2M to be inverted version of Sig1 and Sig2. The high on SigComb and low on SigSel mean that the MuxOut signal will occur when /Sig1 OR /Sig2 occurs, that is, NOT (Sig1 AND Sig2). Refer to the Signal Combination Logic table provided above.

Figure 17:
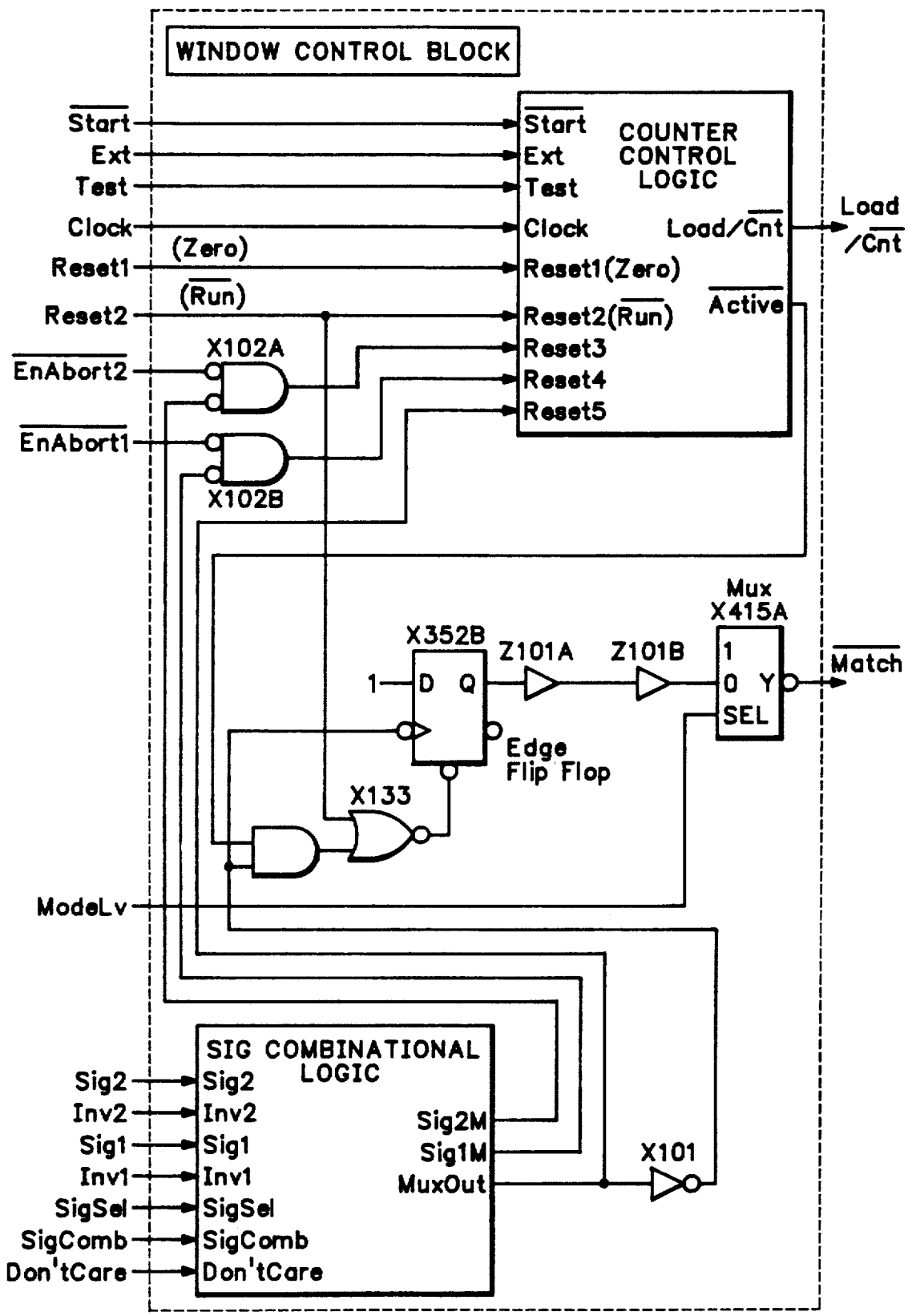
FIG. 17 is a diagram of the match logic in the "specific edge" mode.

Referring to FIGS. 11 and 17, the "specific edge" mode is a more selective form of "either or both edges" mode. The additional logic is associated with the inputs to Reset3 and Reset4 of the Counter Control Logic and may be thought of as the "wrong edge" logic. This logic consists of negative-input AND gates X102A and X102B which operate to reset the Counter Control Logic if an undesired change occurs in one of the Sig#M signals. These gates are enabled by the signals /EnAbort1 and /EnAbort2 which define which signal is not supposed to occur.

The setup of the Signal Combination Logic and the manner in which /Active is cleared are different in the "specific edge" mode than they were in the "either or both edges" mode. Signal Combination Logic is setup so that MuxOut selects the signal that should change and the state that it should change to. The Sig#M output of the signal that should not change during the evaluation interval is set to a desired state for that signal by the associated Inv# signal. The reset path for that signal is enabled by the associated /EnAbort# signal, so that a change in this signal (the signal that should not change if the desired behavior occurs), when it occurs before a change in the desired signal, resets the Active Flip-Flop X352A via the /Active signal. When the desired change occurs first, the circuit behaves as it did in the "either or both edges" mode. If neither signal changes, Zero will ultimately occur and the Active Flip-Flop will be reset without a /Match having been generated.

As an example of "specific edge" mode operation, let us assume that both Sig1 and Sig2 are going to enter the evaluation window in their high condition and that what is desired is for Sig1 to go low before the end of the evaluation interval and Sig2 to remain high until after Sig1 changes. The Signal Combination Logic is now set up as follows: Inv1 is made high and Inv2, SigSel, SigComb, and Don'tCare are all made low. Thus, MuxOut will go high and clock the Edge Flip-Flop X352B set when Sig1 goes low. /EnAbort2 is made low and /EnAbort1 is made high, so that a change in Sig2M which occurs before MuxOut will reset the Active Flip-Flop and terminate the window.

Figure 18A:
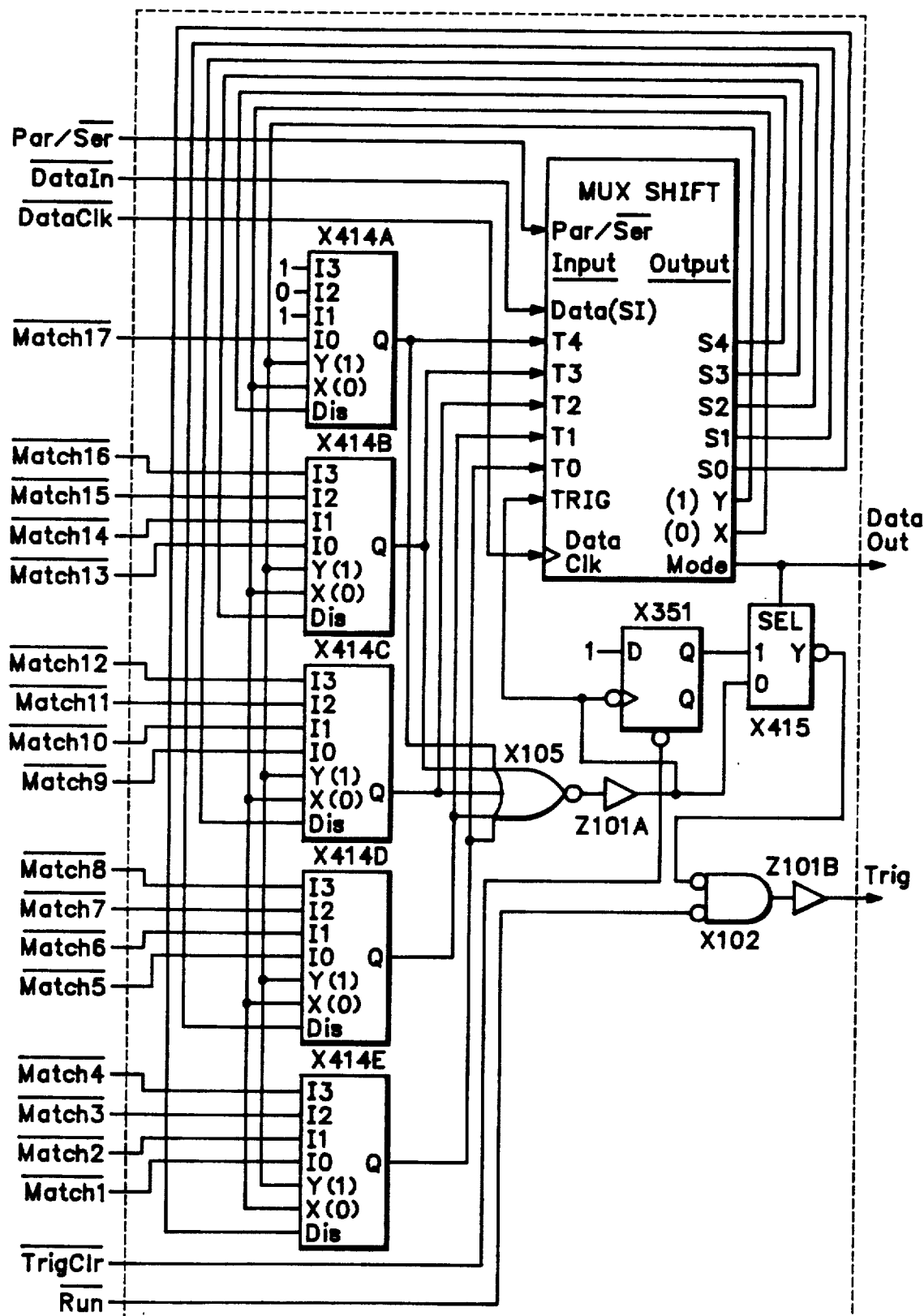
FIG. 18A is a block and schematic diagram of the multiplexer trigger source circuit.

Referring to FIGS. 18A and B, the purpose of the Multiplexer Trigger Source circuitry is to select which of the seventeen /Match signals, sixteen from the evaluation windows and one from the Start Sequence block, will be the source of the Trig signal. Recall that the user specifies a sequence of behaviors that a signal or pair of signals must exhibit in order to be recognized as the sequence that should cause a trigger to be generated. These behaviors are programmed into a sequence of evaluation windows, which pass along the task of actively monitoring the signal from one window to the next only if the criteria are all met along the way. The Multiplexer Trigger Source is programmed to use the /Match output of the last of these utilized evaluation windows as the trigger output, Trig.

The Multiplexer Trigger Source consists of a Mux Shift Register circuit that is part of the distributed 272 bit shift register, five 4-to-1 multiplexers X414A-414E with their outputs joined through a NOR gate X105, and some other output circuitry.

Figure 19:
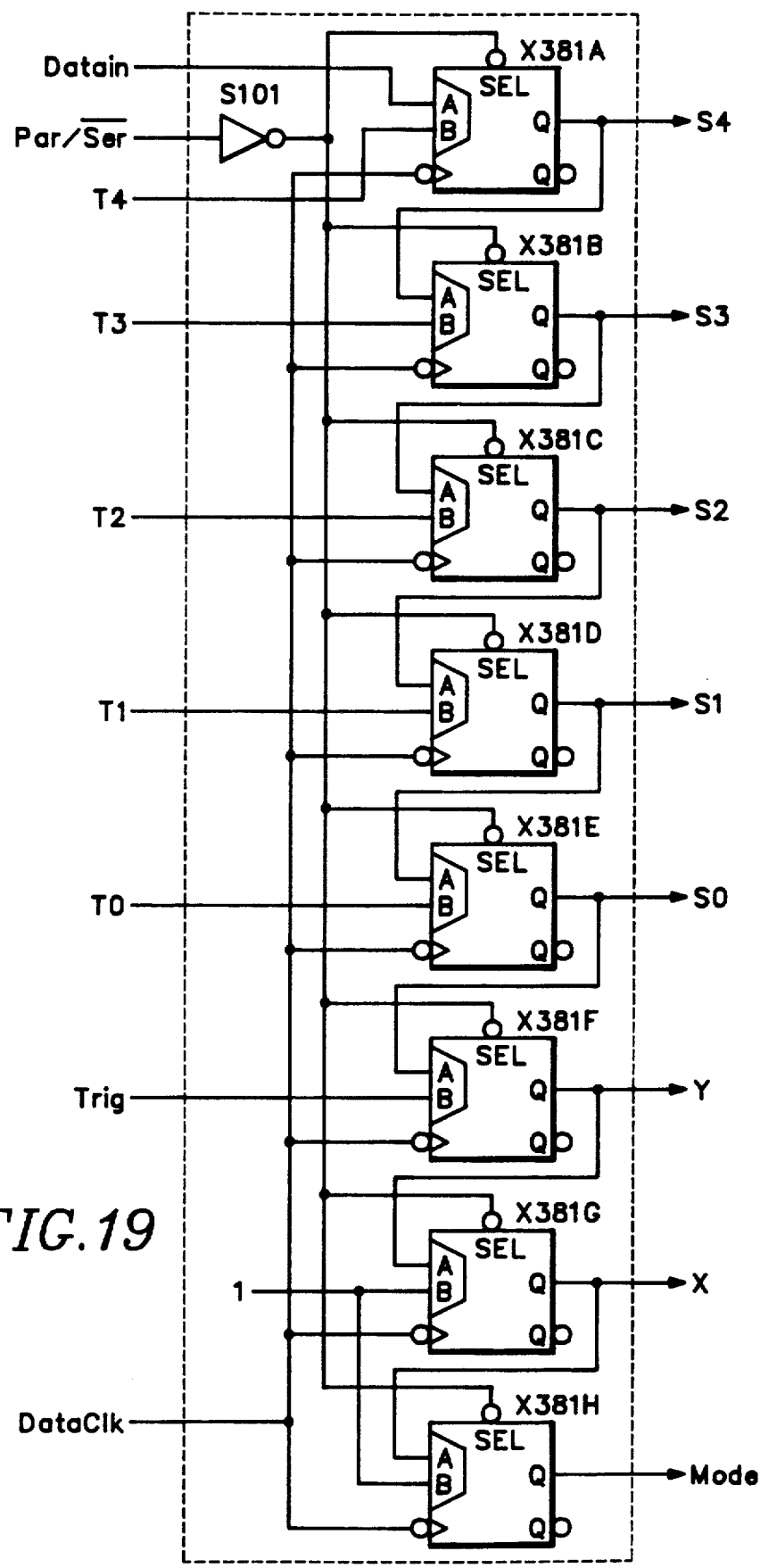
FIG. 19 is a schematic diagram of the mux shift register circuit.

Referring to FIG. 19, the Mux Shift Register is identical to the eight bit shift register in the Sequence Start block. It is loaded serially when Par/not-Ser is low as part of the overall shift register, receiving the input data via DataIn on each DataClk clock pulse. Six of the eight parallel inputs are used to monitor the outputs of the five 4-to-1 multiplexers and the NOR gate for diagnostic purposes. This data is transferred into the Mux Shift Register in parallel when Par/not-Ser is high. The outputs of the Mus Shift Register control which /Match signal the combined multiplexer selects and the output mode.

The S0-S4 outputs of the Mux Shift Register are connected to the DISable inputs of the 4-to-1 multiplexers X414A-X414E, so that a particular multiplexer is enabled by a low on the Sx output connected to its DIS input, while all of the other multiplexers are disabled by high levels on their DIS inputs. The X and Y outputs of the shift Register select which of the four inputs of the selected multiplexer are its output. Refer to the table "Mux Source Selection" of FIG. 18B for a listing of the significance of all combinations of the input signals X, Y, and S0-S4.

The Mode output of the Mux Shift Register selects between a pulsed version of the Trig output and a latched version held by the flip-flop X351. The pulsed version, selected by Mode low, lasts for the duration of the /Match signal, while the latched version, selected by Mode high, lasts until cleared by /TrgClr. /TrgClr is typically connected to a return line from the acquisition system being triggered by the sequential event detector to provide a feedback when the Trig output is received. When /Run is high, the low-input AND gate X102 totally disables the Trig output.

Referring again to FIGS. 4A, B and C, two or more of these sequence of events detectors can be connected together in cascade fashion by connecting the DataOut, /OClk, OSig1, OSig2, and /Match16 outputs of one detector to the DataIn, Clock, TTLSig1, TTLSig2, and /ExtStart inputs, respectively, of the next one. This is made feasible because the delay int he paths of all of these signals has been equalized as much as possible. However, because the delay between sequence of events detectors is greater than the delay between the evaluation windows within one sequence of events detector, care has to be taken in what the waveform is expected to do as the sequence moves from one detector to the next one.

Thus far, the figures and most of the description in this specification have dealt with a two-signal version of the sequence of events detector. However, the principles involved may be extended to alternative versions for a larger or smaller number of signals. The total complexity goes up considerably with each additional signal, especially in the Signal Combination Logic area of the evaluation windows and sequence start circuitry.

Figure 20:
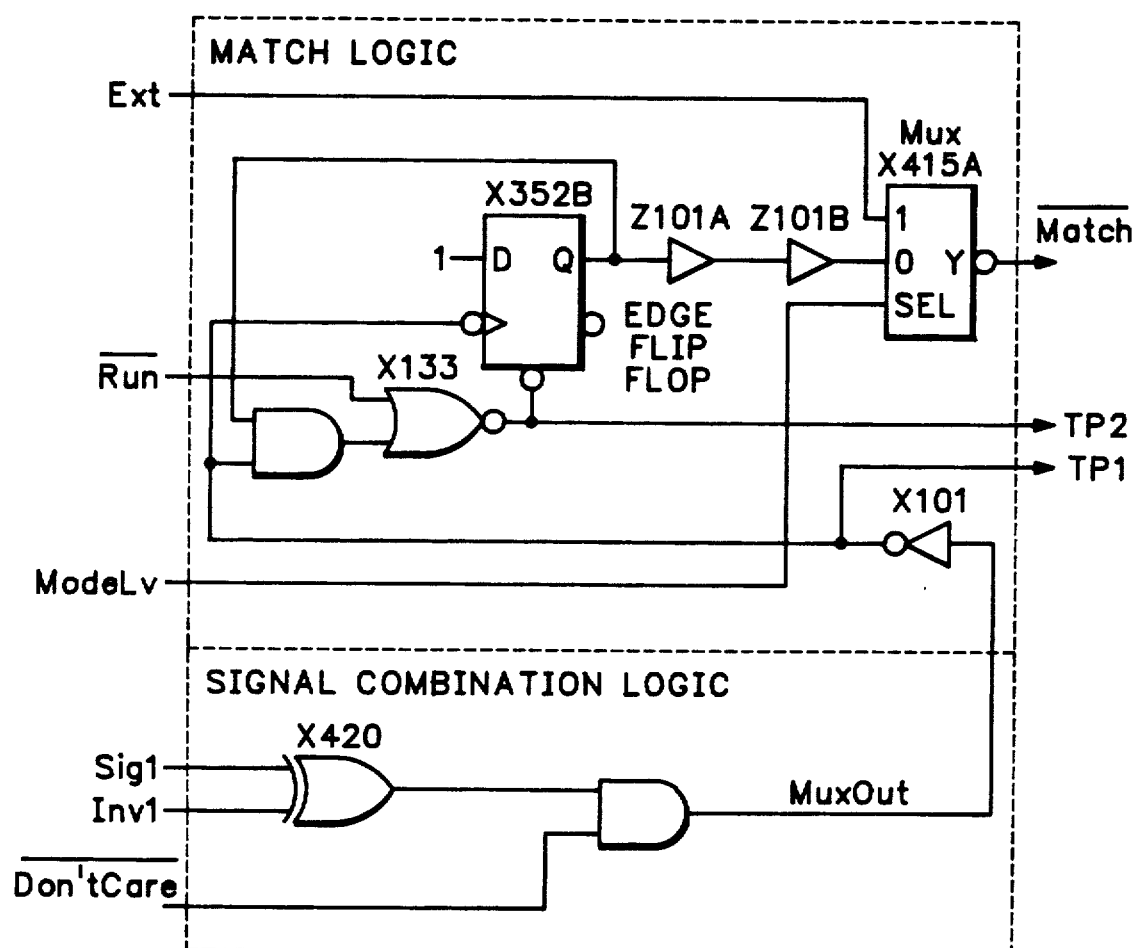
FIG. 20 is a schematic diagram of a single signal version of the start control block of the sequence start circuitry.

Referring to FIG. 20, and comparing it with FIG. 7, it can be seen that for a single signal version of the sequence of events detector the Start Control block, and especially the Signal Combination Logic portion of it, is much simpler. The input signal Sig1 may be inverted by a high state of Inv1 applied to exclusive-OR gate X420. /Don'tCare is normally high but when it is low the AND gate is disabled and MuxOut cannot go high.

Figure 21:
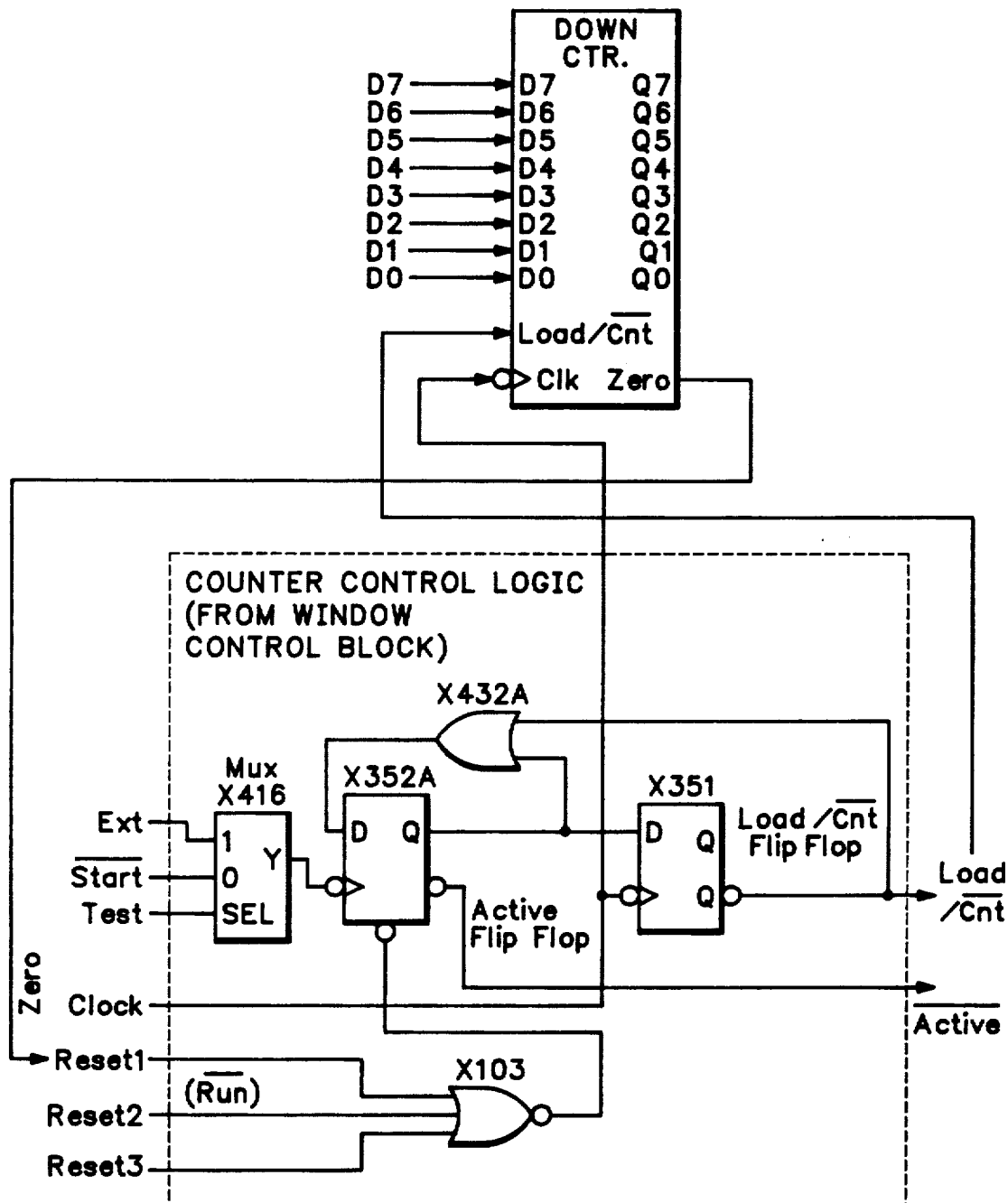
FIG. 21 is a schematic diagram of a single signal version of the counter control logic.

Referring to FIG. 21, and comparing it with FIG. 12, notice that there is also some simplification of the Coutner Control Logic in the single signal version of the sequence of events detector, in that two fewer reset signals are required.

Figure 22:
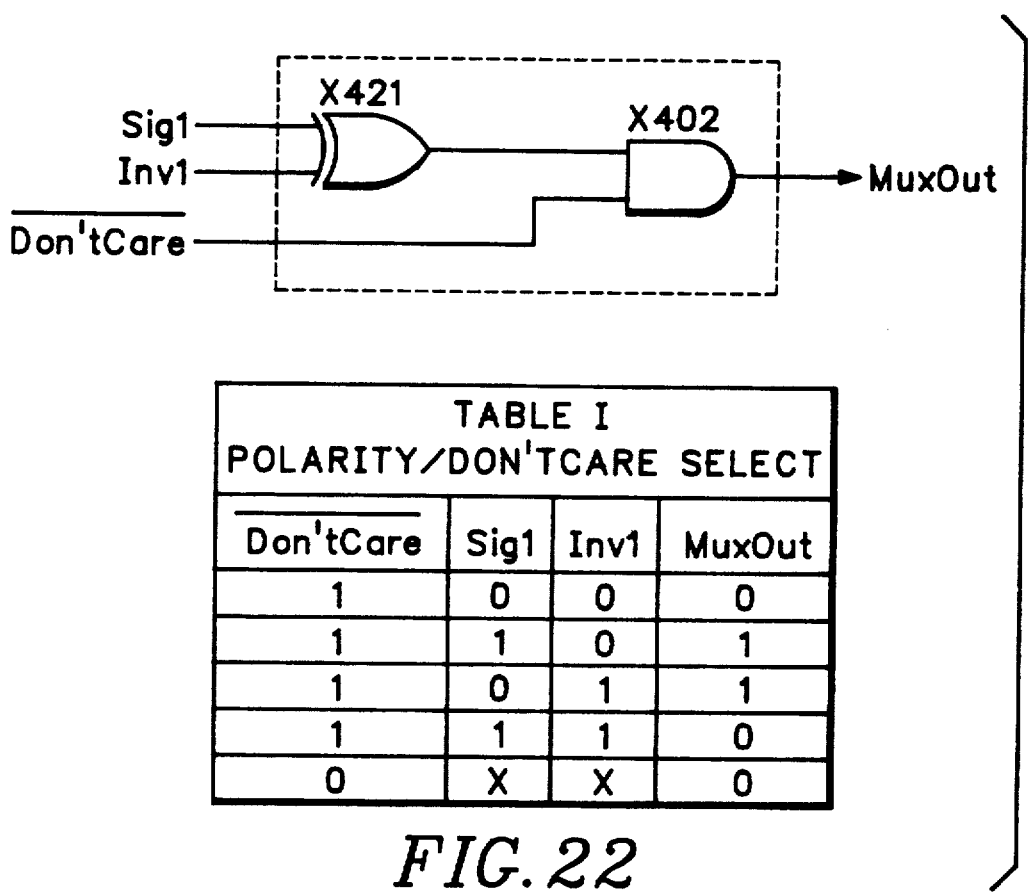
FIG. 22 is a schematic diagram of a single signal version of the signal combination logic.

Referring to FIG. 22, and comparing it with FIG. 13, the main difference in different versions of the sequence of events detector for different numbers of input signals occurs primarily in the Signal Combination Logic portion of the circuitry. A three signal version of this circuit would require another set of SigX and InvX inputs, another control signal, a multiplexer of twice the size, and about twice as many gates as the circuit shown in FIG. 13.

Figure 23:
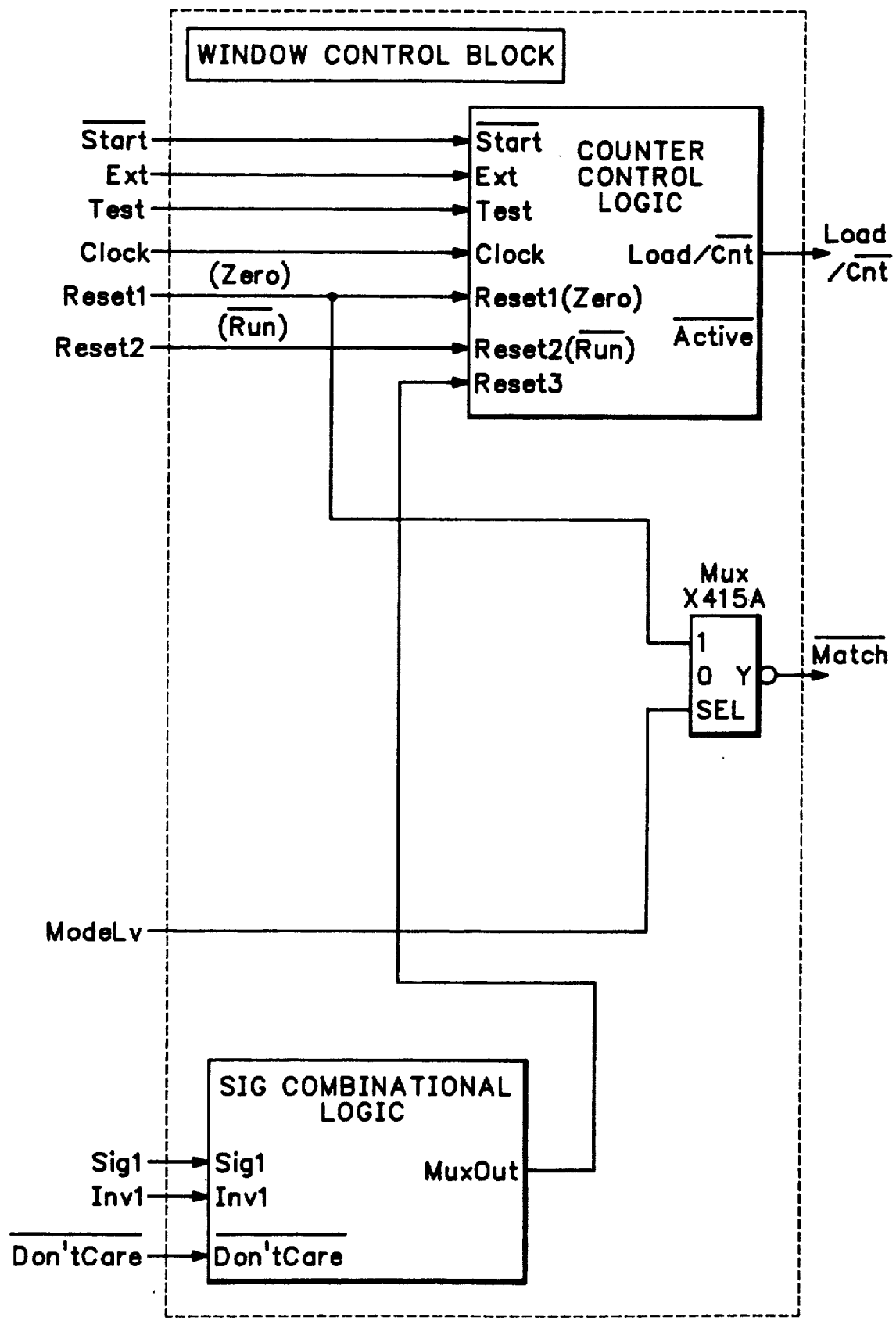
FIG. 23 is a diagram of a single signal version of the match logic in the "level" mode.

Referring to FIG. 23, and comparing it with FIG. 15, it can be seen that the only differences between the Match Logic in the "level" mode of the two signal version and the Match Logic in the "level" mode of the single signal version of the sequence of events detectors are the differences in the number of inputs to the Signal Combination Logic block already discussed above, the fewer number of reset signals in the Counter Control Logic already discussed above, and the connection of MuxOut to Reset3 instead of Reset5.

Figure 24:
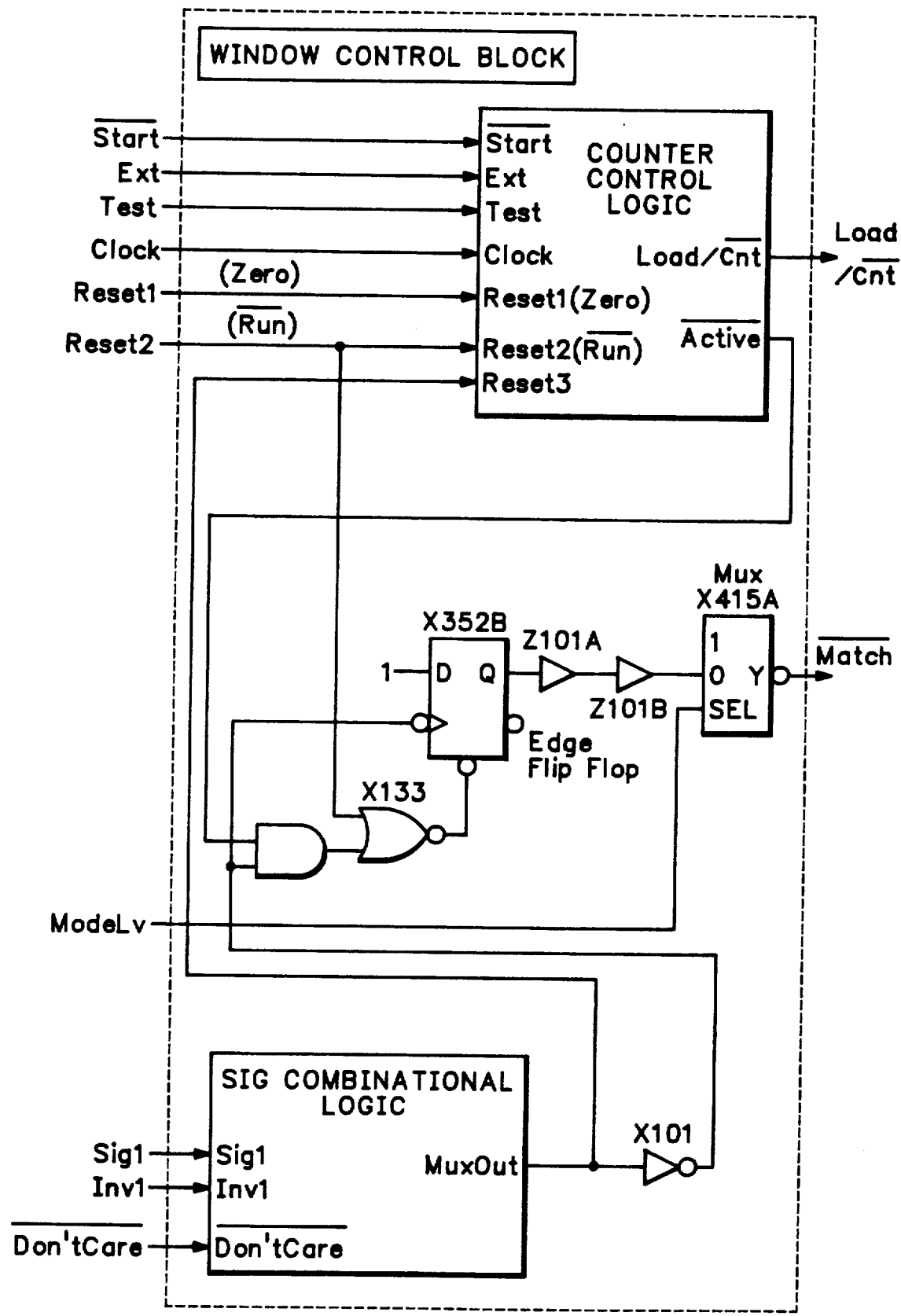
FIG. 24 is a diagram of a single signal version of the match logic in the "edge" mode.

Referring to FIG. 24, and comparing it with FIGS. 16 and 17, it can be seen that there is now no difference between "either or both edges" mode and "specific edge" mode in the single signal version, since there is only one signal to be considered. Some additional circuitry is also dispensed with in the single signal version, i.e., the low-input AND gates X102 that selected particular signals using the signals /EnAbort 1 and /EnAbort2 to gate Sig1M and Sig2M. None of those signals are required in the single signal version either.

Figure 25:
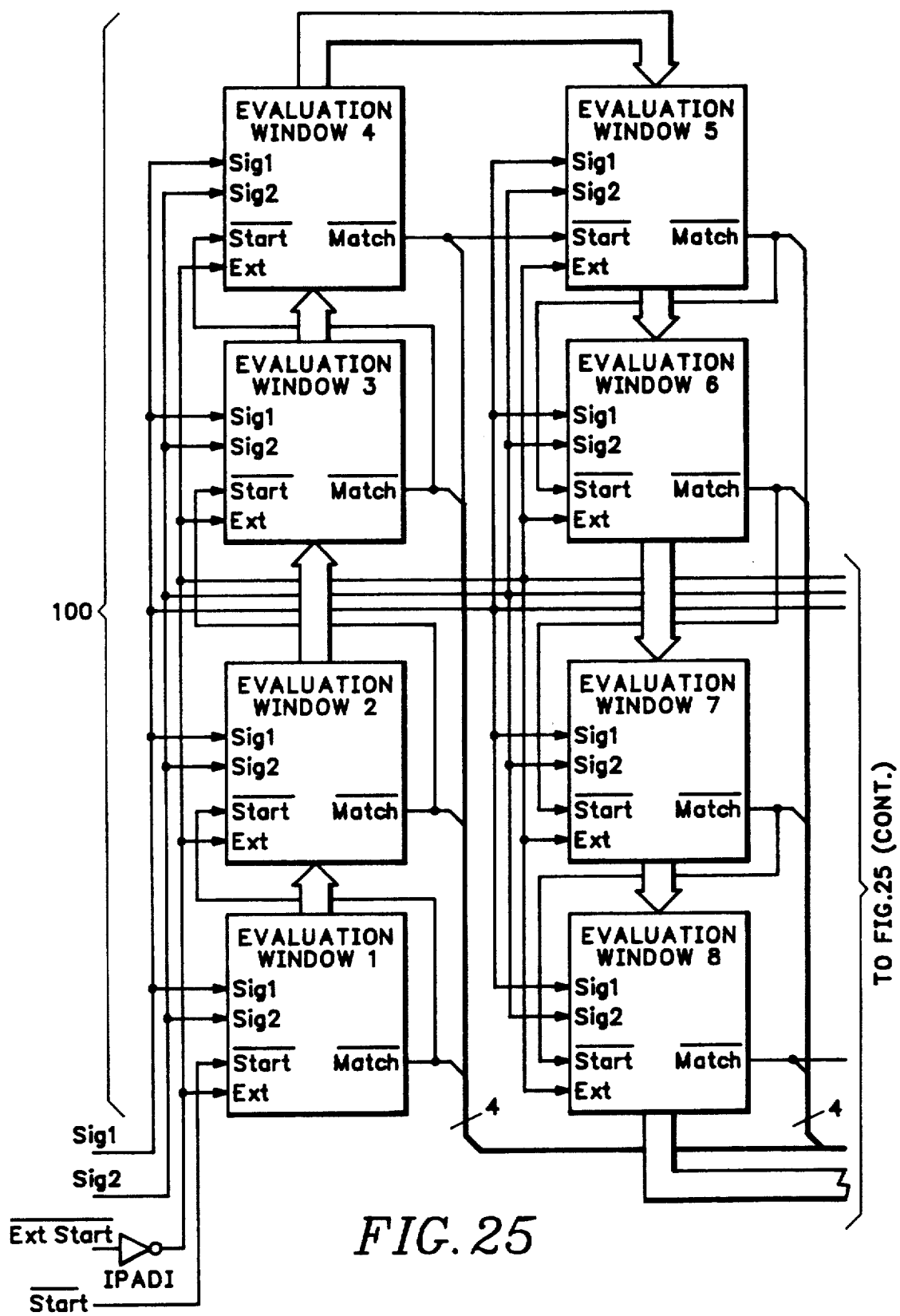
FIG. 25 is a simplified block diagram of the sequence of events detector wherein the evaluation windows are each capable of initiating the sequence of events.
Figure 25:
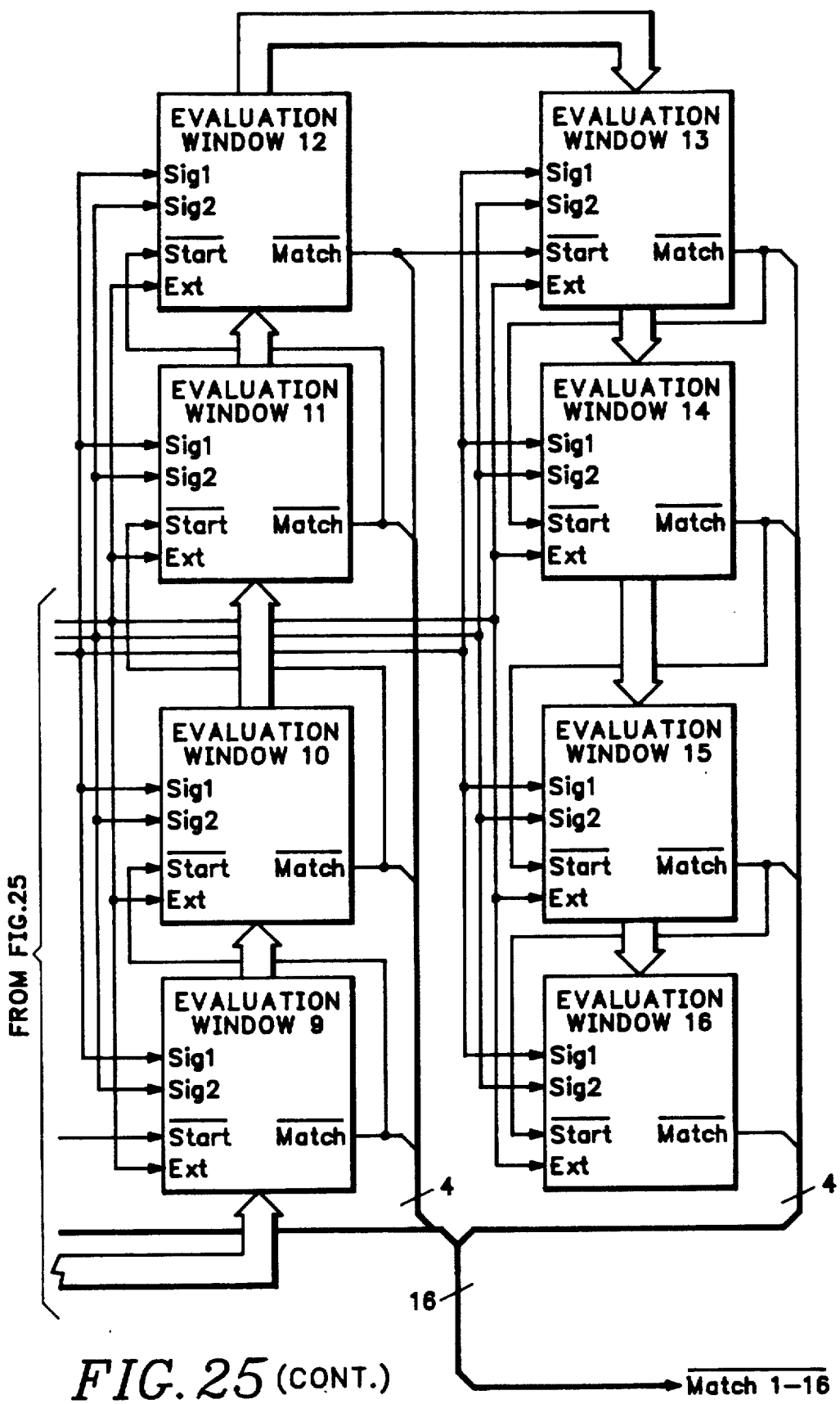

Referring to FIG. 25, and comparing it with FIG. 3, another alternative embodiment of the invention eliminates the need for the sequence start circuitry and the multiplexer trigger source circuitry by making each of the evaluation windows in the array 100 capable of performing the function of the sequence start circuitry. And, because this permits any of the evaluation windows to be used for initiating the beginning of the sequence, the detector can always be used in such a way that the last /Match output is the trigger output signal.

This more general embodiment also permits the sequence of events detector to be partitioned into more than one detector of shorter length. When used this way, more than one of the /Match outputs is used as a trigger output signal.

Figure 26:
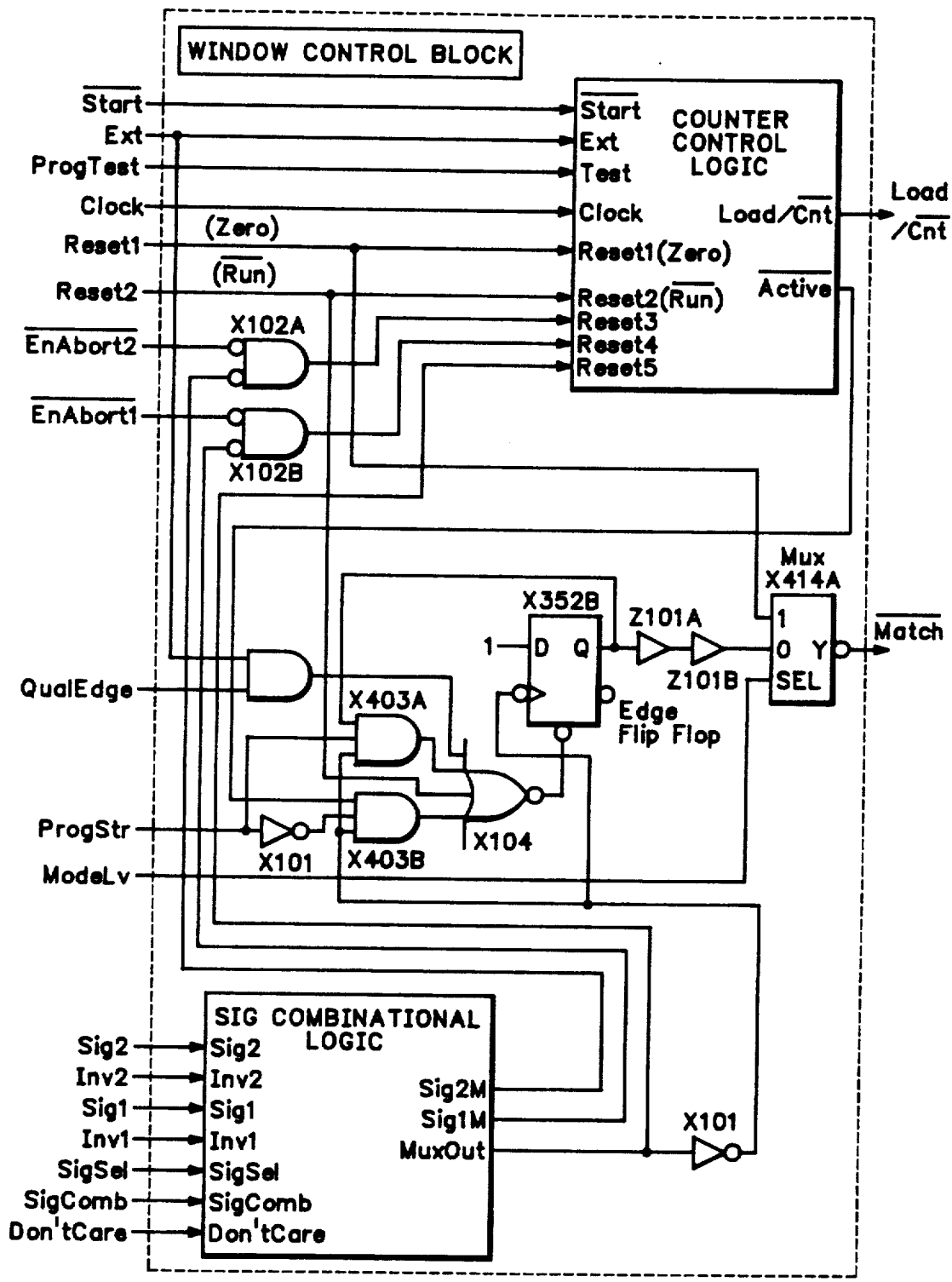
FIG. 26 is a diagram of the window control block for the evaluation windows that are each capable of initiating the sequence of events.

Referring to FIG. 26, and comparing it with FIG. 17, notice that making the evaluation windows universally programmable as if they were sequence start circuitry has required the use of three additional program bits from the shift register circuitry (not shown). This version of the detector therefore requires shift registers in each evaluation window that are at least three bits longer than the shift registers previously described.

The additional programmable signals are ProgTest, a window specific version of the signal Test in the FIG. 17 version, and QualEdge and ProgStr, which are both new. ProgTest operates to cause the Ext signal, rather than /Start, to activate the Counter Control Logic putting this evaluation window in its active condition as a result of an external signal rather than as a result of a match signal from the preceding window. Refer to FIG. 12 to see the internal circuitry of the Counter Control Logic.

The state of the QualEdge signal determines whether a low Ext signal will be necessary for the /Match output to be generated as a result of the occurrence of the specified edge activity. When both QualEdge and Ext are high, the Edge Flip-Flop X352B is held clear by an active signal through the top path of NOR gate X104. Thus, for the Edge Flip-Flop X352B to not be held clear when QualEdge is high, Ext must be low. This allows the /ExtStart signal, which is inverted to become Ext, to be used as a qualifier on the activity of the desired edge behavior programmed into the Signal Combination Logic so that an edge condition cannot be recognized if the qualifying signal is not present.

The programmable start signal, ProgStr, is high when this particular evaluation window is to be used to start the sequence. With ProgStr high, AND gate X403A is enabled and AND gate X403B is disabled. This path will clear the Edge Flip-Flop X352B whenever it is set and MuxOut goes low. When ProgStr is low and the other path through AND gate X403B is enabled, the Edge Flip-Flop X352B is cleared by MuxOut low and /Active high. Thus, with ProgStr low, the Edge Flip-Flop X352B clear circuit acts as shown in FIGS. 11, 16 or 17 of the evaluation window circuits, while when ProgStr is high the clear circuit does not depend on /Active, but rather on feedback of the Edge Flip-Flop's output as in the sequence start circuitry of FIG. 7.

Figure 27:
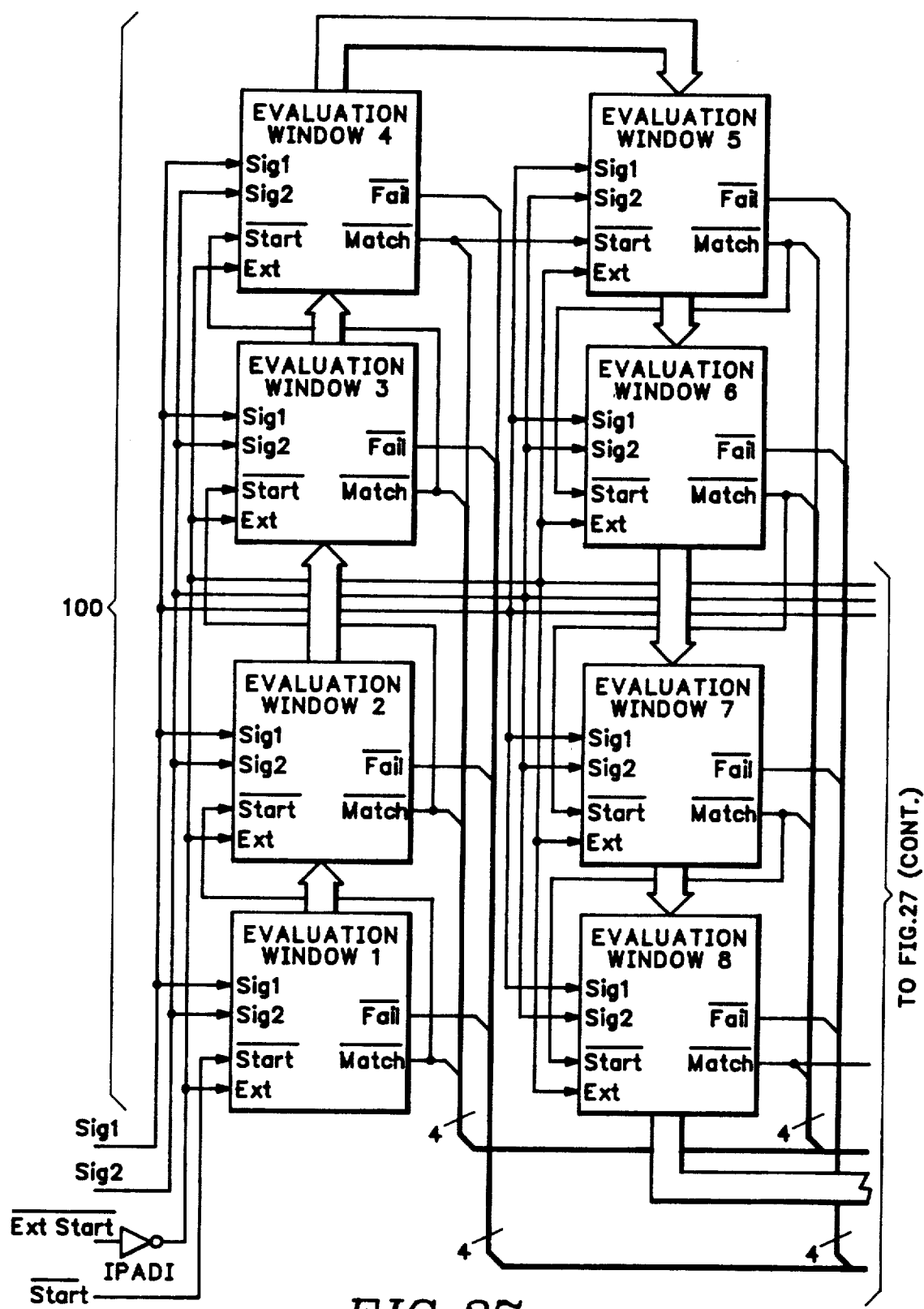
FIG. 27 is a simplified block diagram of the sequence of events detector wherein the evaluation windows are each capable of producing a /Fail signal as well as initiating the sequence of events.
Figure 27:
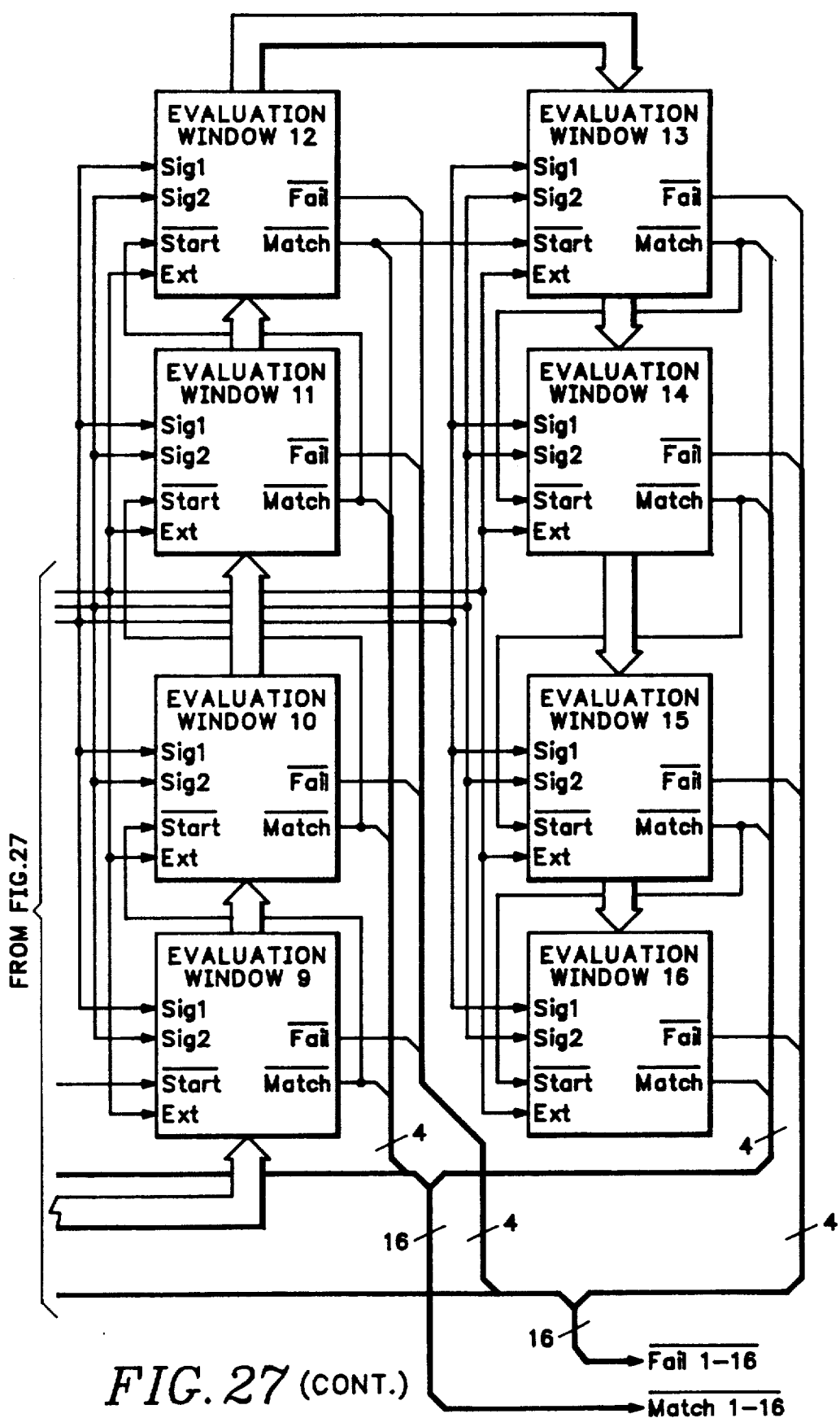

Referring to FIG. 27, another alternative embodiment of the sequence of events detector builds further on the modifications discussed above by adding a /Fail signal output to the capabilities of each evaluation window. In the implementations described previously, the sequence of events detector provided no information about failed sequences. Whereas, in the version of the detector shown in FIG. 27, information is made available that allows the user or other circuitry to ascertain where a sequence is failing if it does not meet all of the criteria for a successful match all of the way through the sequence. And, while not shown in the figures, additional circuitry could feed back fail information from one portion of a partitioned detector to be the external start signal for a second portion of the same partitioned detector.

Figure 28:
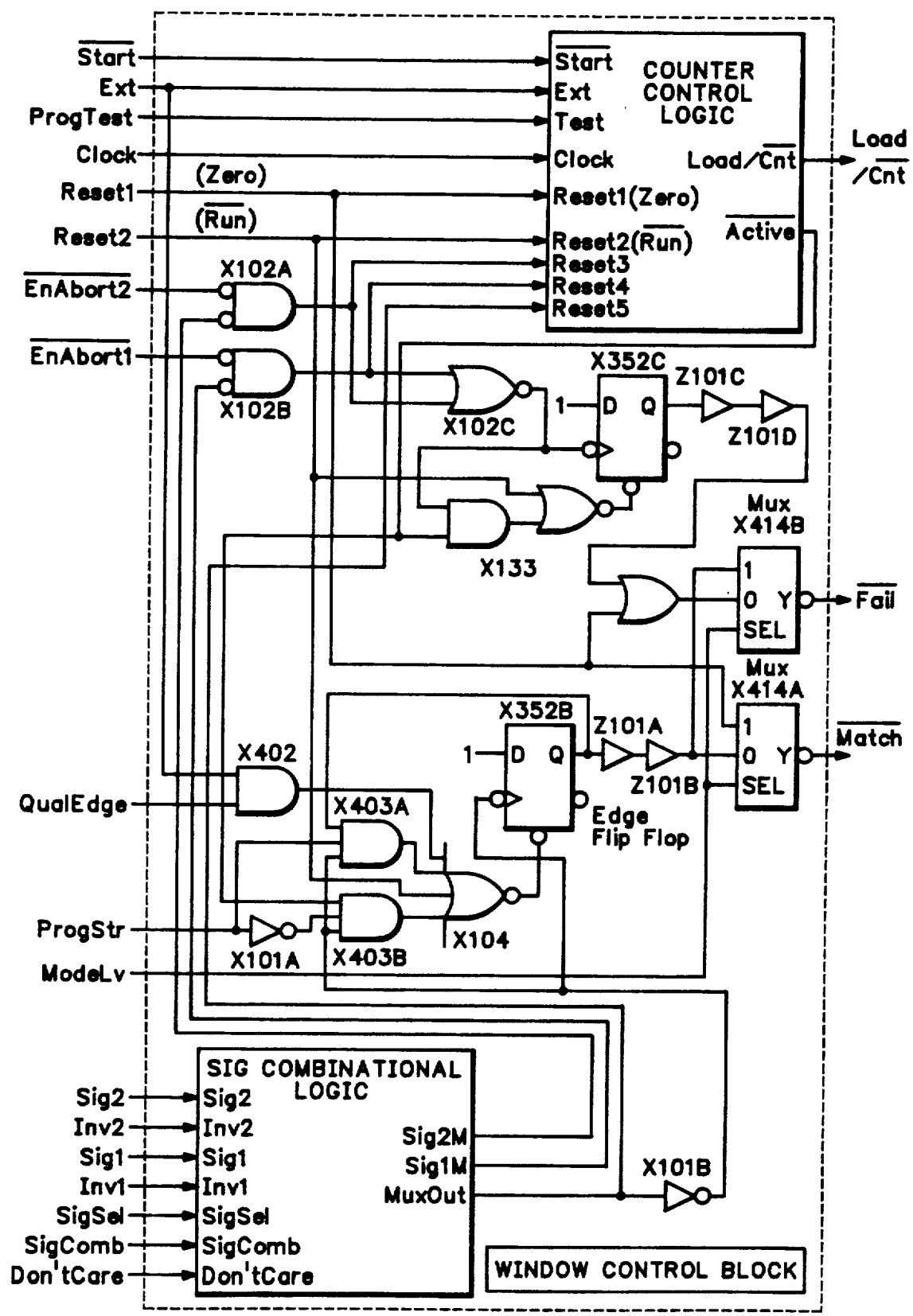
FIG. 28 is a diagram of the window control block for the evaluation windows that are each capable of producing a /Fail signal as well as initiating the sequence of events.

Referring to FIG. 28, and comparing it with FIG. 26, it can be seen that the /Fail output is to some extent a logical complement of the /Match output. For instance, if the Match Logic is in the "level" mode, ModeLv is high so that the /Match output Mux X414A is monitoring Reset1 for an indication (Zero going high) that the evaluation period has passed. But, that same high on ModeLv is also causing the /Fail output Mux X414B to be monitoring the output of the Edge Flip-Flop so that the occurrence of an edge indication from the Signal Combination Logic via MuxOut and the Edge Flip-Flop X352B will generate an active (low) /Fail signal.

When ModeLv is low putting the Match Logic in either the "either or both edges" or "specific edge" mode, the /Match output Mux X414A is monitoring the output of the Edge Flip-Flop X352B and the /Fail output Mux X414B is monitoring the OR gate on its second (select low) input. If no edge satisfies the criteria that the Signal Combination Logic is programmed for and the counter runs out ending the evaluation window, the Zero signal on Reset1 will produce the /Fail output via this path.

The other way that a /Fail signal will be generated is if the Signal Combination Logic is programmed to look for a specific edge and the "wrong edge" logic of low-input AND gates X102A and X102B is set up to look for the occurrence of the unexpected conditions via signals EnAbort1 and EnAbort2. If either of these AND gates X102A or X102B produce a high output, a low-going transition from the output of NOR gate X102C will clock flip-flop X352C true. This in turn will produce a low /Fail output of Mux X414B. Once set, flip-flop X352C is cleared by either a high on /Run or by /Active being high at the same time that the output of NOR gate X102C goes high indicating the end of the "wrong edge" condition.

While the two signal version of the sequence of events detector has been described in terms of two independent digital signals as input, these two signals could in fact be derived from one signal whose activity is being examined by reference to two different thresholds. For example, TTL signal whose maximum logic levels are 3.0 V and 0.0 V could be examined at 0.8 V and 2.0 V. With their thresholds set to these values, a positive output of both comparators would indicate that the signal is above 2.0 Volts and definitely a "1", while a negative output of both comparators would indicate that the signal is below 0.8 V and definitely a "0". However, mixed outputs of the two comparators would indicate that the signal was in the ambiguous region between 0.8 V and 2.0 V. It can be seen that with this sort of setup, the behavior of this signal can be very precisely monitored with the sequence of events detector by using the output of one of the comparators as Sig1 and the output of the other comparator as Sig2.

While all of the event durations described thus far have been finite and limited by the size of the down counter, with the addition of another logic gate and another programmed bit (not shown in the figures), an infinite duration could be selected by disabling the down counter output by changing the state of the added gate using the additional programmed bit.

Several embodiments of the present invention have been shown and described, but it will be apparent to those skilled in the art that many other changes and modifications may be made without departing from the invention in its broader aspects. The following claims are therefore intended to cover all such changes and modifications as fall within the true scope and spirit of the invention.

We claim:

1. A method for detecting a sequence of events in serial digital data comprising the steps of:
   programming a plurality of evaluation windows coupled to each other in series, each programmed with a desired behavior of the serial digital data defining a specific event in the sequence of events, so that the plurality of evaluation windows continuously define the sequence of events to be detected;
   activating the first evaluation window in the series;

applying the serial digital data to each evaluation window in parallel;

matching the desired behavior of each evaluation window with the serial digital data to produce a match signal when the desired behavior occurs and the evaluation window is activated by the match signal from a preceding evaluation window;

activating each evaluation window in the series to perform the matching step when the match signal is received from the preceeding evaluation window; and selecting as an output signal the match signal of an evaluation window in the series programmed to define the sequence of events to be detected.

2. A method as recited in claim 1 wherein the programming step comprises the steps of: selecting a duration for each evaluation window; and choosing the specific event that is to occur within the duration of each evaluation window.

3. A method as recited in claim 2 wherein the choosing step comprises choosing among the following set of specific events: a signal from the serial digital data staying high, the signal staying low, the signal transitioning from high to low, the signal transitioning from low to high, and don't care.

4. A method as recited in claim 2 wherein the choosing step comprises the steps of:
deciding on a state of a Boolean combination of at least two separate signals from the serial digital data; and
determining whether the specific event is leaving the decided on state, arriving at the decided on state or remaining in the decided on state.

5. A method as recited in claim 1 wherein the matching step further comprises the step of reporting a failure when the match signal is not produced while the evaluation window is activated.

6. A method as recited in claim 1 wherein the serial digital data comprises a plurality of separate signals.

7. A method as recited in claim 1 wherein the serial digital data comprises two separate signals.

8. A method as recited in claim 7 wherein the matching step further comprises the step of reporting a failure when the match signal is not produced while the evaluation window is activated.

9. A method as recited in claim 8 wherein the second activating step occurs when the failure is reported.

10. An apparatus for detecting a sequence of events in serial digital data comprising:
a plurality of evaluation window circuits coupled in series, each coupled in parallel to receive the serial digital data and each performing an evaluation process by comparing the behavior of the serial digital data with a set of pre-programmed decision criteria defining a specific event in the sequence of events, the evaluation process being activated within each evaluation window circuit by the receipt of a match signal from the preceding evaluation window circuit in the series, the evaluation process producing the match signal for activating the next evaluation window circuit in the series when the behavior of the serial digital data matches the set of pre-programmed decision criteria and the evaluation window circuit is activated by the match signal from the preceding evaluation window circuit in the series;
means for activating the first evaluation window circuit in the series; and
a trigger generation circuit coupled to receive the match signals from all of the evaluation window circuits and being programmed to select for output the match signal of a particular one of the evaluation window circuits.

11. An apparatus as recited in claim 10 wherein the means for activating is a sequence start circuit coupled to activate the evaluation process of the first evaluation window circuit upon the receipt of an external command or upon the occurrence of a pre-selected behavior of the serial digital data.

12. An apparatus as recited in claim 10 wherein the means for activating is the application of control signals to one of the evaluation window circuits.

13. An apparatus as recited in claim 12 wherein each evaluation window circuit produces a fail signal if the behavior of the serial digital data when the evaluation window circuit is activated does not match the set of pre-programmed decision criteria.

14. An apparatus as recited in claim 13 further comprising a trigger generation circuit coupled to receive the match signals from all of the evaluation window circuits and being programmed to select for output the match signal of a particular one of the evaluation window circuits.

15. An apparatus for detecting a sequence of events in serial digital data comprising:
a plurality of evaluation window circuits coupled in series, each coupled in parallel to receive the serial digital data and each performing an evaluation process by comparing the behavior of the serial digital data with a set of pre-programmed decision criteria defining a specific event in the sequence of events, the evaluation process being activated within each evaluation window circuit by the receipt of a match signal from the preceding evaluation window circuit in the series, the evaluation process producing the match signal for activating the next evaluation window circuit in the series when the behavior of the serial digital data matches the set of pre-programmed decision criteria and the evaluation window circuit is activated by the match signal from the preceding evaluation window circuit in the series or producing a fail signal if the behavior of the serial digital data when the evaluation window circuit is activated does not match the set of pre-programmed decision criteria;
means for activating the first evaluation window circuit in the series; and
a trigger generation circuit coupled to receive the match signals from all of the evaluation window circuits and being programmed to select for output the match signal of a particular one of the evaluation window circuits or the fail signal from one or more of the evaluation window circuits.

16. An apparatus for detecting a sequence of events in serial digital data, the serial data including a first digital signal and a second digital signal, comprising:
a plurality of evaluation window circuits coupled in series, each coupled in parallel to receive the first and second digital data and each performing an evaluation process by comparing the behavior of the first and second digital data with a set of pre-programmed decision criteria defining a specific event in the sequence of events, the evaluation process being activated within each evaluation window circuit by the receipt of a match signal from the preceding evaluation window circuit in the series, the evaluation process producing the match signal for activating the next evaluation window circuit in the series when the behavior of the first and second digital signals matches the set of pre-programmed decision criteria and the evaluation window circuit is activated by the match signal from the preceding evaluation window circuit in the series;

means for activating the first evaluation window circuit in the series; and a trigger generation circuit coupled to receive the match signals from all of the evaluation window circuits and being programmed to select for output the match signal of a particular one of the evaluation window circuits.

17. An apparatus as recited in claim 16 wherein the means for activating is a sequence start circuit coupled to activate the evaluation process of the first evaluation window circuit upon the receipt of an external command or upon the occurrence of a pre-selected behavior of the first and second digital signals.

18. An apparatus as recited in claim 16 wherein the first and second digital signals are derived from monitoring a third digital signal from the serial digital data at two different thresholds.

19. An apparatus as recited in claim 16 wherein the means for activating is the application of control signals to one of the evaluation window circuits.

20. An apparatus as recited in claim 19 wherein each evaluation window circuit produces a fail signal if the behavior of the first and second digital signals when the evaluation window circuit is activated does not match the set of pre-programmed decision criteria.

21. An apparatus as recited in claim 20 wherein one of the control signals is the fail signal from another one of the evaluation window circuits.

22. An apparatus as recited in claim 20 further comprising a trigger generation circuit coupled to receive the match signals from all of the evaluation window circuits and being programmed to select for output the match signal of a particular one of the evaluation window circuits.

23. An apparatus for detecting a sequence of events in serial digital data, the serial data including a first digital signal and a second digital signal, comprising:

a plurality of evaluation window circuits coupled in series, each coupled in parallel to receive the first and second serial digital signals and each performing an evaluation process by comparing the behavior of the first and second serial digital signals with a set of pre-programmed decision criteria defining a specific event in the sequence of events, the evaluation process being activated within each evaluation window circuit by the receipt of a match signal from the preceding evaluation window circuit in the series, the evaluation process producing the match signal for activating the next evaluation window circuit in the series when the behavior of the first and second digital signals matches the set of pre-programmed decision criteria and the evaluation window circuit is activated by the match signal from the preceding evaluation window circuit in the series or producing a fail signal if the behavior of the first and second serial digital signals when the evaluation window circuit is activated does not match the set of pre-programmed decision criteria;

means for activating the first evaluation window circuit in the series; and a trigger generation circuit coupled to receive the match signals from all of the evaluation window circuits and being programmed to select for output the match signal of a particular one of the evaluation window circuits or the fail signal from one or more of the evaluation window circuits.

24. An apparatus for detecting a sequence of events in serial digital data, the serial digital data including a plurality of digital signals, comprising:

a plurality of evaluation window circuits coupled in series, each coupled in parallel to receive the plurality of digital signals and each performing an evaluation process by comparing the behavior of the serial digital data with a set of pre-programmed decision criteria defining a specific event in the sequence of events, the evaluation process being activated within each evaluation window circuit by the receipt of a match signal from the preceding evaluation window circuit in the series, the evaluation process producing the match signal for activating the next evaluation window circuit in the series when the behavior of the plurality of digital signals matches the set of pre-programmed decision criteria and the evaluation window circuit is activated by the match signal from the preceding evaluation window circuit in the series;

means for activating the first evaluation window circuit in the series; and a trigger generation circuit coupled to receive the match signals from all of the evaluation window circuits and being programmed to select for output the match signal of a particular one of the evaluation window circuits.

25. An apparatus as recited in claim 24 wherein the means for activating is a sequence start circuit coupled to activate the evaluation process of the first evaluation window circuit upon the receipt of an external command or upon the occurrence of a pre-selected behavior of the plurality of digital signals.

26. An apparatus as recited in claim 24 wherein the means for activating is the application of control signals to one of the evaluation window circuits.

27. An apparatus as recited in claim 26 wherein each evaluation window circuit produces a fail signal if the behavior of the plurality of digital signals when the evaluation window circuit is activated does not match the set of pre-programmed decision criteria.

28. An apparatus as recited in claim 27 wherein one of the control signals is the fail signal from another one of the evaluation window circuits.

29. An apparatus for detecting a sequence of events in serial digital data, the serial digital data including a plurality of serial digital signals, comprising:

a plurality of evaluation window circuits coupled in series, each coupled in parallel to receive the plurality of serial digital signals and each performing an evaluation process by comparing the behavior of the plurality of serial digital signals with a set of pre-programmed decision criteria defining a specific event in the sequence of events, the evaluation process being activated within each evaluation window circuit by the receipt of a match signal from the preceding evaluation window circuit in the series, the evaluation process producing the match signal for activating the next evaluation window circuit in the series when the behavior of the plurality of serial digital signals matches the set of pre-programmed decision criteria and the evaluation window circuit is activated by the match signal from the preceding evaluation window circuit in the series or producing a fail signal if the behavior of the plurality of serial digital signals when the evaluation window circuit is activated does not match the set of pre-programmed decision criteria;

means for activating the first evaluation window circuit in the series; and a trigger generation circuit coupled to receive the match signals from all of the evaluation window circuits and being programmed to select for output the match signal of a particular one of the evaluation window circuits or the fail signal from one or more of the evaluation window circuits.

* * * * *